United States Patent
Wang et al.

(10) Patent No.: US 11,228,323 B2
(45) Date of Patent: Jan. 18, 2022

(54) METHOD AND SYSTEM FOR REPAIRING REED-SOLOMON CODES

(71) Applicant: The Regents of the University of California, Oakland, CA (US)

(72) Inventors: Zhiying Wang, Irvine, CA (US); Weiqi Li, Irvine, CA (US); Hamid Jafarkhani, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 16/887,804

(22) Filed: May 29, 2020

(65) Prior Publication Data
US 2020/0382141 A1 Dec. 3, 2020

Related U.S. Application Data

(60) Provisional application No. 62/855,361, filed on May 31, 2019.

(51) Int. Cl.
*H03M 13/00* (2006.01)
*H03M 13/29* (2006.01)
(Continued)

(52) U.S. Cl.
CPC ..... *H03M 13/2906* (2013.01); *G06F 11/1076* (2013.01); *H03M 13/154* (2013.01); *H03M 13/1515* (2013.01)

(58) Field of Classification Search
None
See application file for complete search history.

(56) References Cited

U.S. PATENT DOCUMENTS 10,218,789 B2 * 2/2019 Yang ................. H03M 13/3761
10,425,106 B2 * 9/2019 Halbawi ........... H03M 13/1515
(Continued)

OTHER PUBLICATIONS

Y. S. Han, H. Pai, R. Zheng and W. H. Mow, "Efficient Exact Regenerating Codes for Byzantine Fault Tolerance in Distributed Networked Storage," in IEEE Transactions on Communications, vol. 62, No. 2, pp. 385-397, Feb. 2014, doi: 10.1109/TCOMM.2013.122313.130492. (Year: 2014).*
(Continued)

*Primary Examiner* — Daniel F. McMahon
(74) *Attorney, Agent, or Firm* — John P. Teresinski

(57) ABSTRACT

Methods and devices are provided for error correction of distributed data in distributed systems using Reed-Solomon codes. In one embodiment, processes are provided for error correction that include receiving a first correction code for data fragments stored in storage nodes, constructing a second correction code responsive to an unavailable storage node of the storage nodes, performing erasure repair of the unavailable storage node, and outputting a corrected data fragment. The first correction code is a Reed-Solomon code represented as a polynomial and the second correction code is represented as a second polynomial with an increased subpacketization size. Processes are configured to account for repair bandwidth and sub-packetization size. Code constructions and repair schemes accommodate different sizes of evaluation points and provide a flexible tradeoff between the subpacketization size repair bandwidth of codes. In addition, schemes are provided to manage a single node failure and multiple node failures.

20 Claims, 7 Drawing Sheets

(51) Int. Cl.
*H03M 13/15* (2006.01)
*G06F 11/10* (2006.01)

(56) References Cited

U.S. PATENT DOCUMENTS

| | | | | |
|---|---|---|---|---|
| 2004/0088636 | A1* | 5/2004 | Cypher | G06F 11/1048 |
| | | | | 714/764 |
| 2014/0152476 | A1* | 6/2014 | Oggier | H03M 13/3761 |
| | | | | 341/94 |
| 2015/0095747 | A1* | 4/2015 | Tamo | H03M 13/373 |
| | | | | 714/781 |
| 2017/0060469 | A1* | 3/2017 | Luby | G06F 3/0689 |
| 2017/0077950 | A1* | 3/2017 | Pavlov | H03M 13/611 |
| 2018/0121286 | A1* | 5/2018 | Sipos | G06F 11/1076 |
| 2019/0109603 | A1* | 4/2019 | Ruano | H03M 13/373 |
| 2019/0158119 | A1* | 5/2019 | Shany | H03M 13/1515 |

OTHER PUBLICATIONS

Q. Sun, L. Nie, L. Sun, L. Fu and J. Sun, "Hybrid Redundancy Fault Tolerant Codec in Distributed Storage System," 2015 International Conference on Industrial Informatics—Computing Technology, Intelligent Technology, Industrial Information Integration, 2015, pp. 22-25, doi: 10.1109/ICIICII.2015.93. (Year: 2015).*

* cited by examiner

METHOD AND SYSTEM FOR REPAIRING REED-SOLOMON CODES

CROSS REFERENCE TO RELATED APPLICATIONS

This application claims priority to U.S. Provisional Application No. 62/855,361 titled METHOD AND SYSTEM FOR REPAIRING REED-SOLOMON CODES filed on May 31, 2019, the content of which is expressly incorporated by reference in its entirety.

FIELD

The present disclosure generally relates to methods for determining error correcting codes for storage systems, distributed storage, and repairing erasures.

BACKGROUND

Reed-Solomon (RS) codes are very popular in distributed systems because they provide efficient implementation and high failure-correction capability for a given redundancy level. RS Codes have been used in systems such as Google's Colossus, Quantcast File System, Facebook's f4, Yahoo Object Store, Baidu's Atlas, Backblaze's Vaults, and Hadoop Distributed File System. However, the transmission traffic for repair failures is a huge problem for the application of RS codes.

Existing repair processes for RS codes, such as Shanmugam et al. considered the repair of scalar codes for the first time. Guruswami and Wootters (2017) proposed a repair scheme for RS codes. For an RS code with length n and dimension k over the field F, it achieves the repair bandwidth of n−1 symbols over GF(q). Dau and Milenkovic (2017) improved the scheme using full-length codes. Ye and Barg (2016) proposed a scheme that asymptotically approaches the MSR (minimum storage regenerating) bandwidth lower bound of $l(n-1)/(n-k)$ where the sub-packetization size is $l=(n-k)n$. Tamo et al. (2017) provided an RS code repair scheme achieving the MSR bound and the sub-packetization size is approximately $n^n$. These two schemes are called MSR schemes.

The repair problem for RS codes can also be generalized to multiple erasures. In this case, the schemes in Dau et al. (2018) and Mardia et al. (2018) work for the full-length code, and Ye et al. (2017) proposed a scheme achieving the multiple-erasure MSR bound. The full-length RS code has high repair bandwidth, and the MSR-achieving RS code has large sub-packetization.

A flexible tradeoff between the sub-packetization size and the repair bandwidth is an open problem of previous schemes. Only the full-length RS code with high repair bandwidth and the MSR-achieving RS code with large sub-packetization are established. There is a need for providing more points between the two extremes—the full-length code and the MSR code. One straightforward method is to apply the schemes to the case of $l > \log_q n$ with fixed (n, k). However, the resulting normalized repair bandwidth grows with $l$, contradictory to the idea that a larger $l$ implies smaller normalized bandwidth.

There is a desire for improvements in repair bandwidths and processes and configurations for RS code repair.

BRIEF SUMMARY OF THE EMBODIMENTS

Disclosed and claimed herein are systems and methods for efficient repair of Reed-Solomon codes. In one embodiment, a method for error correction of distributed data includes receiving, by a device, a first correction code for a plurality of data fragments. These fragments are stored in a plurality of storage nodes. The first correction code is a Reed-Solomon code having a data symbol for each the plurality of storage nodes. Moreover, this correction code is represented as a first polynomial over a first finite field and has a first subpacketization size. The method also includes constructing, by the device, a second correction code in response to at least one unavailable storage node of the plurality of storage nodes. The second correction code is represented as a second polynomial over a second finite field and has an increased subpacketization size relative to the first polynomial. The method includes performing, by the device, erasure repair for the at least one unavailable storage node using the second correction code. The second correction code is applied to available data fragments of the plurality of data fragments for erasure repair. In one embodiment, the erasure repair utilizes at least one coset of a multiplicative group of the second finite field. The method also includes outputting, by the device, a corrected data fragment based on the erasure repair.

In one embodiment, the second correction code is constructed is for single erasure repair. The erasure repair utilizes at least one of one coset and two cosets. In this embodiment, the code length (n) and dimension (k) of the first correction code are maintained.

In one embodiment, the second correction code is constructed for single erasure repair. The erasure repair utilizes multiple cosets. In this embodiment, the code length (n) of the second correction code is increased and redundancy (r) is fixed.

In one embodiment, the second correction code is constructed for single erasure repair. In this embodiment, the second correction code provides a scalar code with evaluation points selected from one coset.

In one embodiment, the second correction code is constructed for single erasure repair with evaluation points in selected two cosets. In this embodiment, the erasure repair includes selection of correction code polynomials that have a full rank condition in a coset of an unavailable node and rank 1 when evaluated at another coset.

In one embodiment, the second correction code is constructed for single erasure repair. In this embodiment, the evaluation points for erasure repair are chosen from multiple cosets to increase code length.

In one embodiment, the second correction code is constructed for repairing multiple erasures in the plurality of data fragments. In this embodiment, the erasure repair includes use of a helper node to reconstruct at least one symbol for a first data fragment. Moreover, in this embodiment, the reconstructed symbol is used for erasure error of a second data fragment.

In one embodiment, the erasure repair includes using a first dual codeword and a second dual codeword as repair polynomials. Additionally, this embodiment includes combining a trace function with dual codewords in order to generate fragments.

In one embodiment, the method for error correction of distributed data as described above further includes determining an erasure repair scheme for the plurality of data fragments.

Another embodiment is directed to a device configured for error correction of distributed data that includes modifying a Reed-Solomon correction code. The device includes an interface configured to receive a first correction code for a plurality of data fragments stored in a plurality of storage nodes. In this embodiment, the correction code is a Reed-Solomon code having a data symbol for each the plurality of storage nodes. Moreover, the first correction code is represented as a first polynomial over a first finite field and has a first subpacketization size. The device further includes a repair module, coupled to the interface. The repair module is configured to construct a second correction code in response to at least one unavailable storage node of the plurality of storage nodes. In this embodiment, the second correction code is a second polynomial representation over a second finite field. The second polynomial representation has an increased subpacketization size relative to the first polynomial. The repair module is further configured to perform erasure repair for the at least one unavailable storage node using the second correction code. The second correction code is applied to available data fragments of the plurality of data fragments for erasure repair. The erasure repair utilizes at least one coset of a multiplicative group of the second finite field. In this embodiment, the repair module is further configured to output a corrected data fragment based on the erasure repair.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE EXEMPLARY EMBODIMENTS

Overview and Terminology

Figure 1:
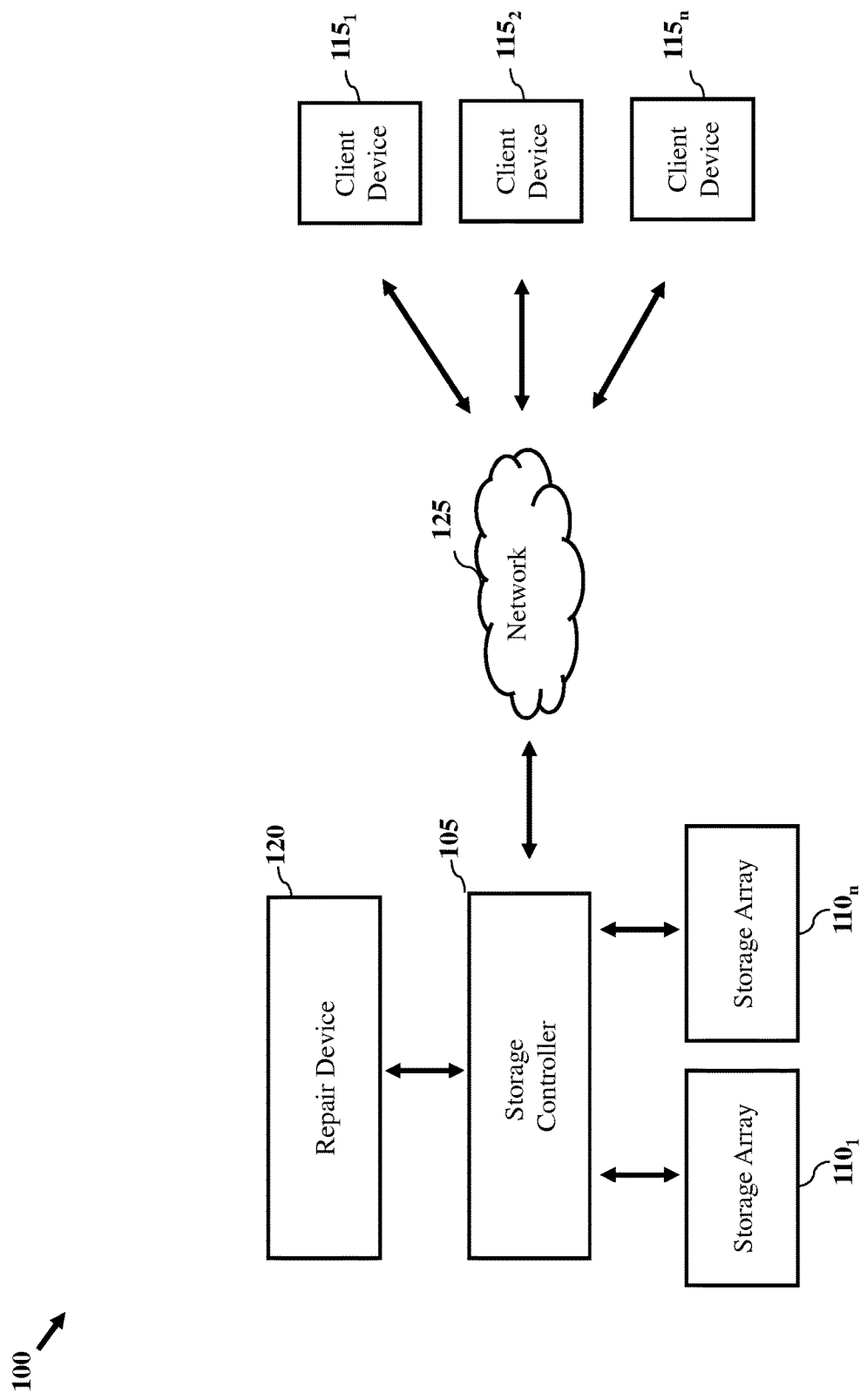
FIG. 1 illustrates an exemplary network architecture for performing error correction of distributed data according to one or more embodiments.

One aspect of the disclosure is directed to determining error correcting codes for storage systems, distributed storage, and repairing erasure.

In distributed storage, storage nodes may be unavailable for data access due to node failure or temporary high workload. To alleviate this issue, erasure correcting codes are applied to a plurality of storage nodes for a plurality of data fragments. Each storage node may correspond to one symbol of the erasure correcting code (e.g., codeword). Reed-Solomon (RS) codes are one of the most widely used codes. In particular, for $k$ information nodes, $n-k$ redundant parities nodes are added and RS codes can tolerate $n-k$ unavailable nodes. However, when node unavailability occurs, a lot of communication traffic is incurred in order to repair the information. Schemes that require the traffic equal to the content of $k$ storage nodes are prohibitive in large-scale storage systems. Embodiments herein provide methods/algorithms to implement the repair of the RS codes that require less transmission (i.e., less repair bandwidth) compared to existing repair codes. Moreover, methods described here achieve low complexity for a given bandwidth since sub-packetization size is small, and account for bandwidth considerations.

In distributed storage, every code word symbol corresponds to a storage node, and communication costs between storage nodes need to be considered when node failures are repaired. The repair bandwidth is defined as the amount of transmission required to repair a single node erasure, or failure, from the remaining nodes (called helper nodes). For an RS code over the finite field $F=GF(q^l)$, the sub-packetization size of the code is l. Here q is a prime number, and the finite field may relate to a Galois field. As used herein erasure may include one or more of lost, corrupt and unavailable code fragments. Small repair bandwidth is desirable to reduce the network traffic in distributed storage. Small sub-packetization is attractive due to the complexity in field arithmetic operations. Embodiments discussed herein provide constructions and repair algorithms of RS codes to provide a flexible tradeoff between the repair bandwidth and the sub-packetization size.

Erasure codes are ubiquitous in distributed storage systems because they can efficiently store data while protecting against failures. Reed-Solomon (RS) code is one of the most commonly used codes because it achieves the Singleton bound and has efficient encoding and decoding methods. Codes matching the Singleton bound are called maximum distance separable (MDS) codes, and they have the highest possible failure-correction capability for a given redundancy level. In distributed storage, every code word symbol corresponds to a storage node, and communication costs between storage nodes need to be considered when node failures are repaired. Repair bandwidth of RS codes, may be defined as the amount of transmission required to repair a single node erasure, or failure, from all the remaining nodes (called helper nodes). For a given erasure code, when each node corresponds to a single finite field symbol over $F=GF(q^l)$, the code is said to be scalar; when each node is a vector of finite field symbols in $B=GF(q)$ of length l, it is called a vector code or an array code. In both cases, we say the sub-packetization size of the code is l. Here q is a power of a prime number. Compared to considering the repair of scalar codes for the first time and a recent repair scheme for RS codes where the key idea is that: rather than directly using the helper nodes as symbols over F to repair the failed node, one treats them as vectors over the subfield B. Thus, a helper may transmit less than l symbols over B, resulting in a reduced bandwidth. For an RS code with length n and dimension k over the field F, denoted by RS(n, k), a prior approach achieves a repair bandwidth of n−1 symbols over B. Moreover, when $n=q^l$ (called the full-length RS code) and $n-k=q^{l-1}$, the scheme provides the optimal repair bandwidth. An improved scheme such that the repair bandwidth is optimal for the full-length RS code and any $n-k=q^s$, $1 \leq s \leq \log_q(n-k)$. In one embodiment, the help nodes are treated as vectors over a subfield B, in that the helper stores an element $x \in F$. Any element $x \in F$ can be presented as $x = x_0\beta_0 + x_1\beta_1 + \ldots + x_{l-1}\beta_{l-1}$ with $x_0, x_1, \ldots, x_{l-1} \in B$ and a set of basis $\{\beta_0, \beta_1, \ldots, \beta_1\beta_1\}$ for F over B. For example, $x \in F = GF(2^2) = \{0, 1, \alpha, \alpha^2\}$ can be presented as $x = x_0\beta_0 + x_1\beta_1$ with $x_0, x_1 \in B = GF(2) = \{0, 1\}$ and the basis $\{\beta_0 = 1, \beta_1 = \alpha\}$. Here F is extended from B by a that is a root of the polynomial $x^2 = 1 + x$. Elements included in the subfield B may be the elements in the Galois field $B = GF(q)$. Here are some examples. If $q = 2$, the subfield $B = GF(2) = \{0, 1\}$. If q is a prime number, the subfield is $B = GF(q) = \{0, 1, \ldots, q-1\}$. If $q = 4$, the subfield is $B = GF(2^2) = \{0, 1, \alpha, \alpha^2\}$. The relationship between the subfield B and the finite field F may be that F is the Galois field extended from B by a monic irreducible polynomial of degree 1. All elements of B are contained in F. See the previous example of $F = GF(2^2) = \{0, 1, \alpha, \alpha^2\}$ and $B = GF(2) = \{0, 1\}$.

For the full-length RS code, some schemes are optimal for single erasure. However, the repair bandwidth of these schemes still has a big gap from the minimum storage regenerating (MSR) bound. In particular, for an arbitrary MDS code, the repair bandwidth b, measured in the number of symbols over GF(q), is lower bounded by $$b \geq \frac{\ell(n-1)}{n-k}. \quad (1)$$

An MDS code satisfying the above bound is called an MSR code. In fact, most known MSR codes are vector codes. For the repair of RS codes, proposed schemes that asymptotically approach the MSR bound as n grows when the sub-packetization size is $\Sigma = (n-k)_n$. A technique provided an RS code repair scheme achieving the MSR bound when the sub-packetization size is $l = n^n$.

The repair problem for RS codes can also be generalized to multiple erasures. In this case, the schemes work for the full-length code and for centralized repair. According to one embodiment, a scheme is provided for achieving the multiple-erasure MSR bound.

The need for small repair bandwidth is motivated by reducing the network traffic in distributed storage, and the need for the small sub-packetization is due to the complexity in field arithmetic operations. It is demonstrated that the time complexity of multiplications in larger fields are much higher than that of smaller fields. Moreover, multiplication in Galois fields are usually done by pre-computed look-up tables and the growing field size has a significant impact on the space complexity of multiplication operations. Larger fields require huge memories for the look-up table. For example, in GF ($2^{16}$), 8 GB are required for the complete table, which is impractical in most current systems. Some logarithm tables and sub-tables are used to alleviate the memory problems for large fields, while increasing the time complexity at the same time. For example, in the Intel SIMD methods, multiplications over GF ($2^{16}$) need twice the amount of operations as over GF ($2^8$), and multiplications over GF ($2^{32}$) need 4 times the amount of operations compared to GF ($2^8$), which causes the multiplication speed to drop significantly when the field size grows.

To illustrate the impact of the sub-packetization size on the complexity, an encoding example is provided. To encode a single parity check node, k multiplications and k additions need to be performed over $GF(q^l)$. For a given systematic RS (n, k) code over $GF(q^l)$, we can encode $kl \log_2 q$ bits of information by multiplications of $(n-k)kl \log_2 q$ bits and additions of $(n-k)kl \log_2 q$ bits. When M bits are encoded into RS (n, k) codes, we need $M/(kl \log_2 q)$ copies of the code and we need multiplications of $M(n-k)$ bits and additions of $M(n-k)$ bits in $GF(q^l)$ in total. Although the total amount of bits we need to multiply is independent of l, the complexity over a larger field is higher in both time and space. For a simulation of the RS code speed using different field sizes on different platforms, RS codes may have faster implementation in both encoding and decoding for smaller fields.

Besides complexity, the small sub-packetization level also has many advantages such as easy system implementation, great flexibility and bandwidth-efficient access to missing small files, which makes it important in distributed storage applications.

As can be seen from the two extremes, a small sub-packetization level also means higher costs in repair bandwidth, and not many other codes are known besides the extremes. For vector codes, existing systems may provide small sub-packetization codes with small repair bandwidth, but only for single erasure or also present a tradeoff between the sub-packetization level and the repair bandwidth for the proposed HashTag codes implemented in Hadoop. For scalar codes, an MSR scheme has been extended to a smaller sub-packetization size, but it only works for certain redundancy r and single erasure.

Embodiments herein are directed to a design for three single-erasure RS repair schemes, using the cosets of the multiplicative group of the finite field F. Note that the RS code can be viewed as n evaluations of a polynomial over F. The evaluation points of the three schemes are part of one coset, of two cosets, and of multiple cosets, respectively, so that the evaluation point size can vary from a very small number to the whole field size. In the schemes designed in this paper, parameter is provided that can be tuned, and provides a tradeoff between the sub-packetization size and the repair bandwidth.

According to one embodiment, a first scheme is provided for an RS (n, k) code that achieves the repair bandwidth $$\frac{\ell}{a}(n-1)(a-s)$$

for some a, s such that $n < q^a$, $r \triangleq n - \bar{k} > q^s$ and a divides l. Specifically, for the RS (14, 10) code, we achieve repair bandwidth of 52 bits with $l = 8$, which is 35% better than the naive repair scheme.

According to another embodiment, a second scheme reaches the repair bandwidth of $$(n-1)\frac{\ell + a}{2}$$

for some such that $n \leq 2(q^a - 1)$, a divides l and $$\frac{\ell}{r} < a.$$

According to another embodiment, a third scheme attains the repair bandwidth of $$\frac{\ell}{r}(n+1+(r-1)(q^a-2)) \text{ when } n \le (q^a-1)\log_r \frac{\ell}{a}.$$

Another realization of the third scheme attains the repair bandwidth of $$\frac{\ell}{r}(n-1+(r-1)(q^a-2))$$

where $$\ell \approx a\left(\frac{n}{q^a-1}\right)^{\left(\frac{n}{q^a-1}\right)}.$$

The second realization can also be generalized to any d helpers, for k≤d≤n−1.

Embodiments provide characterizations of linear multiple-erasure re-pair schemes, and propose two schemes for multiple erasures, where the evaluation points are in one coset and in multiple cosets, respectively. Again, the parameter a is tunable. According to one embodiment, a is a parameter that may be selected to help reduce the repair bandwidth for an RS(n, k) over F. As long as the parameter a satisfies the condition in paragprah [0041], a repair scheme can be provided to reach the repair bandwidth in paragprah [0041]. For example, we can choose a=4 and get repair bandwidth of 52 bits for RS(14,10) over $GF(2^8)$.

According to one aspect, proof is provided that any linear repair scheme for multiple erasures in a scalar MDS code is equivalent to finding a set of dual codewords satisfying certain rank constraints.

For an RS (n, k) code with $$e < \frac{1}{a-s}\sqrt{\log_q n}$$

erasures, our first scheme achieves the repair bandwidth $$\frac{e\ell}{a}(n-e)(a-s)$$

for some a, s such that a, $n<q^a$, $r=n-k>q^s$ and a divides l.

For an RS (n, k) code, our second scheme works for e≤n−k erasures and n−e helpers. The repair bandwidth depends on the location of the erasures and in most cases, we achieve $$\frac{e\ell}{d-k+e}(n-e+(n-k+e)(q^a-2)) \text{ where } \ell \approx a\left(\frac{n}{q^a-1}\right)^{\left(\frac{n}{q^a-1}\right)}$$

and a divides l. We demonstrate that repairing multiple erasures simultaneously is advantageous compared to repairing single erasures separately.

According to one aspect of the disclosure, processes and configurations are provided for less repair bandwidth, and less complexity for a given bandwidth. These processes may account for the tradeoff between complexity and repair bandwidth. The processes apply to any RS code parameters.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment," "certain embodiments," "an embodiment," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation.

Exemplary Embodiments

FIG. 1 illustrates an exemplary network architecture according to one embodiment for error correction of distributed data. This exemplary network architecture may include efficient repair of Reed-Solomon codes. Storage in a distributed storage system (DSS) often requires erasure encoding. System 100 relates an exemplary distributed storage system. As discussed herein, systems and processes are provided for determining repair codes for one or more network applications. As shown in FIG. 1, system 100 includes a storage controller 105, plurality of storage arrays $110_{1-n}$, client devices $115_{1-n}$, and repair device 120. System 100 can includes a plurality of components and/or devices relative to a communication network 125. System 100 may be configured to provide one or more applications for more or more network services and network enterprises. Applications and enterprises may be executed by client devices $115_{1-n}$ and storage controller 105 may be configured to store data for the enterprises and applications to one or more storage arrays $110_{1-n}$ . . . According to one embodiment, repair device 120 maybe configured to determine repair codes for data stored by system 100. According to another embodiment, one or elements of system 100 may include functional modules and/or components for determining erasure codes.

Elements of FIG. 1 are exemplary and system 100 may include one or more other components of elements including one or more servers, firewalls, routers, switches, security appliances, antivirus servers, or other useful network devices, along with appropriate software.

In distributed storage, storage nodes, such as storage arrays $110_{1-n}$ may be unavailable for data access due to node failure or temporary high workload. To alleviate this issue, erasure correcting codes are applied and each storage node corresponds to one symbol of the codeword.

Embodiments described herein are directed to processes using Reed-Solomon (RS) codes for storage. Erasure encoding may be used for data structures mathematically transformed into n different fragments. One or more original data structures may also be referred to as a file or data. Operations described herein may be directed to one or more data structures and file types. Coded fragments or fragments can include any suitable piece of a file from which the full file may be reconstructed (alone or in conjunction with other fragments), including the formal pieces of a file yielded by the erasure coding technique. Fragments may be referred to as (n,k) Coding. For example in the case where n is 5 and k is 4, the original data structure might be stored with one fragment on each of 5 storage nodes, and if any one of the storage nodes fail, it is possible to reconstruct the original file from any remaining fragments. When a node failure occurs, it may be desirable to reconstruct the erasure encoded file, so that once again the full n fragments are available for redundancy.

A plurality of repair schemes are provided. The comparison of schemes described herein, as well as the comparison to previous works, are shown in Tables I and II, and are discussed in more details below.

Figure 2:
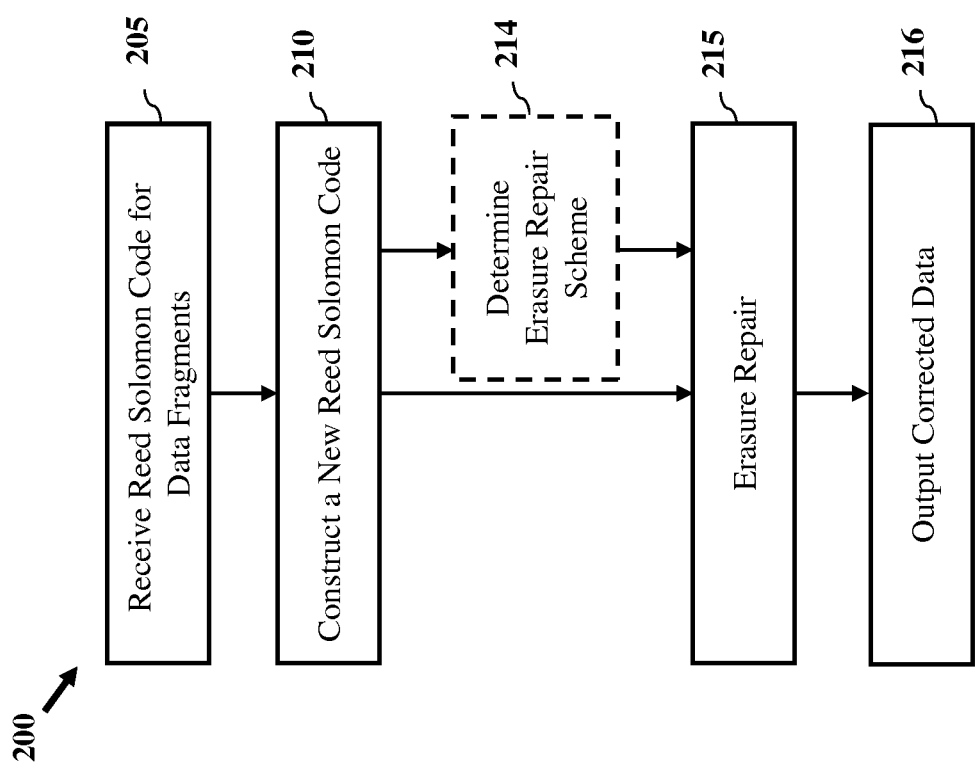
FIG. 2 depicts a process for error correction of distributed data according to one or more embodiments.

FIG. 2 depicts a process 200 for error correction of distributed data based on modifying a Reed-Solomon correction code according to one or more embodiments. Process 200 may be employed by a device, such as repair device (e.g., repair device 120) of a system (e.g., system 100) and one or more other components. According to one embodiment, process 200 may be initiated upon a device (e.g., repair device 120) receiving a first correction code at block 205. The device may receive the first correction code from one or more client devices (e.g., one or more of client devices $115_{1-n}$) via the communication network 125. In one embodiment, the first correction code is received for a plurality of data fragments that are stored in a plurality of storage nodes. Additionally, in one embodiment, the first correction code is a Reed-Solomon code having a data symbol for each of the plurality of storage nodes. The first correction code is represented as a polynomial over a first finite field and has a first subpacketization size. In one embodiment, a finite field has a property such that calculations performed using one or more elements of the field always results in an element with a value that is within the field.

At block 210, process 200 includes constructing a second correction code in response to at least one unavailable storage node of the plurality of storage nodes and/or unavailability one or more data fragments. The second correction code may be represented as a second polynomial over a second finite field and has an increased subpacketization size relative to the first polynomial. In one embodiment, the second correction code is a new Reed-Solomon code constructed using the first correction code. In one embodiment, the unavailability of the storage node may be due to an erasure error in one of the plurality of data fragments stored in the plurality of storage nodes. An erasure error may occur if a storage location of a particular symbol included in one of the data fragments stored in the storage nodes is unknown. In another embodiment, the second correction code is constructed for single erasure repair. In one example of the construction of the second correction code for single erasure repair, the erasure repair utilizes at least one of one coset and two cosets. In this example, the code length (n) and dimension (k) of the first correction code are maintained. In another example of the construction of the second correction code for single erasure repair, the second correction utilizes multiple cosets. In this example, the code length (n) of the second correction code is increased and redundancy (r) is fixed. In another example of the construction of the second correction code for single erasure repair, the second correction code provides a scalar code with evaluation points selected from one coset.

According to another example of the construction of the second correction code for single erasure repair, the second correction code is constructed with evaluation points that are selected in two cosets. In this example, the erasure repair includes selection of correction code polynomials that have a full rank condition in a coset of an unavailable node and a rank 1 when evaluated at another coset. In another example of the construction of the second correction code for single erasure repair, evaluation points for erasure repair are chosen from multiple cosets to increase code length.

In another embodiment, the second correction code is constructed for repairing multiple erasures in the plurality of fragments. In one example of the construction of the second correction code for multiple erasure repair, the erasure repair includes use of a helper node to reconstruct at least one symbol for a first data fragment. In this example, the reconstructed symbol is used for erasure repair of a second fragment. The second correction code (e.g., a new Reed-Solomon code) can be viewed as n evaluations of a polynomial over F. These evaluation points are part of one coset, of two cosets, and of multiple cosets, respectively. As such, the evaluation point size can vary from a very small number to the whole field size.

At block 214, process 200 may optionally determined an erasure repair scheme for the plurality of data fragments. In one embodiment, the determined erasure scheme may be used to repair a single erasure or multiple erasures in using the constructed second correction code.

At block 215, erasure error of the unavailable storage node is performed using the second correction code. In one embodiment, the second correction code is applied to available data fragments of the plurality of data fragments for erasure repair. The erasure error utilizes at least one coset of a multiplicative group of the second finite field. In one embodiment, repairing the erasure includes using a first dual codeword and a second dual codeword as repair polynomials. In this embodiment, a trace function is combined with the dual code words to generate fragments. In one embodiment, the trace function is used to obtain subfield symbols, as described in the "Preliminaries" section below. The use of the trace function in combination with dual codewords is also discussed in the "Reed-Solomon Repair Schemes for Multiple Erasures" and "REPAIR ALGORITHM FOR RS (14, 10) CODE" sections.

According to one embodiment, erasure repair at block 215 includes a first scheme is provided for an RS (n, k) code that achieves the repair bandwidth $$\frac{\ell}{a}(n-1)(a-s)$$

for some a, s such that $n<q^a$, $r \triangleq n-k>q^s$ and a divides l. Specifically, for the RS (14, 10) code, we achieve repair bandwidth of 52 bits with l=8, which is 35% better than the naive repair scheme.

According to another embodiment, erasure repair at block 215 includes a second scheme that reaches the repair bandwidth of $$(n-1)\frac{\ell+a}{2}$$

for some a such that $n \leq 2(q^a-1)$, a divides $l$ and $$\frac{l}{r} < a.$$

According to another embodiment, erasure repair at block 215 includes a third scheme that attains the repair bandwidth of $$\frac{l}{r}(n+1+(r-1)(q^a-2))$$

when $$n \leq (q^a-1)\log_r\frac{l}{a}.$$

Another realization of the third scheme attains the repair bandwidth of $$\frac{l}{r}(n-1-(r-1)(q^a-2))$$

where $$l \approx a\left(\frac{n}{q^a-1}\right)^{\left(\frac{n}{q^a-1}\right)}.$$

The second realization can also be generalized to any d helpers, for $k \leq d \leq n-1$.

Embodiments provide characterizations of linear multiple-erasure re-pair schemes, and propose two schemes for multiple erasures, where the evaluation points are in one coset and in multiple cosets, respectively. Again, the parameter a is tunable.

Process 200 may provide linear repair of RS codes. As used herein, for positive integer i, we use [i] to denote the set $\{1, 2, \ldots, i\}$. For integers a, b, we use a| b to denote that a divides b. For real numbers an, bn, which are functions of n, we use a≈b to denote $$\lim_{n\to\infty}\frac{a_n}{b_n}=1.$$

For sets $A \subseteq B$, we use B/A to denote the difference of A from B. For a finite field F, we denote by $\mathbb{F}^*=\mathbb{F}/\{0\}$ the corresponding multiplicative group. We write $\mathbb{E} \leq \mathbb{F}$ for $\mathbb{E}$ being a subfield of $\mathbb{F}$. For element $\beta \in F$ and E as a subset of F, we denote $\beta E=\{\beta s, \forall s \in E\} A^T$ denotes the transpose of the matrix A.

At block 216, process 200 includes outputting a corrected data based on the erasure repair that is performed in block 215. In one embodiment, errors in one or more of the plurality of data fragments are corrected and the data fragments are restored in their entirety such that information associated with all data fragments stored in the storage nodes are accessible and known. Output of data can include output of a corrected fragment.

According to one embodiment, erasure correcting codes in erasure schemes determined by process 200 are applied with respect to each storage node corresponding to one symbol of the codeword. Similarly, erasure correcting codes determined by process 200 may be for storage systems, distributed storage, and repairing erasures. In one embodiment, process 200 also includes a parameter that can be tuned, and provides a tradeoff between the sub-packetization size and the repair bandwidth.

Figure 3:
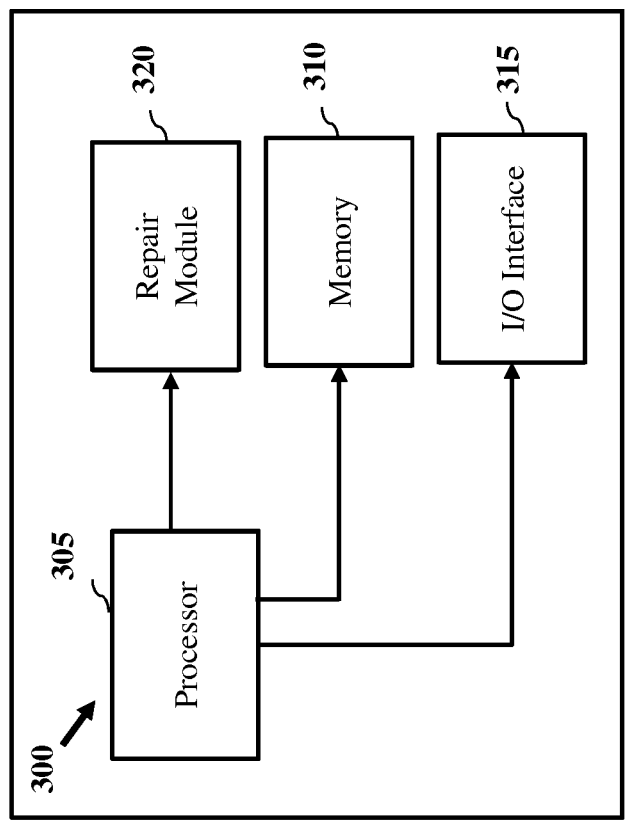
FIG. 3 depicts a diagram of a computing device that may be configured for error correction of distributed data according to one or more embodiments.

FIG. 3 depicts a diagram of a computing device 300 that may be configured for error correction of distributed data based on modifying a Reed-Solomon correction code according to one or more embodiments. Unit 300 includes processor 305, memory 310, and input/output interface 315. In some embodiments, unit 300 may also include a repair module 320. In certain embodiments, repair module may relate to functional element of processor 305. Unit 300 may be configured to receive data from one or more devices.

Processor 305 may be configured to provide one or more repair functions, including determine one or more of a single erasure, and multiple erasures. According to one embodiment, processor 305 is configured to perform one or more operations. Memory 310 may include ROM and RAM memory for operation of unit 300 and processor 305. Input/output interface 315 may include one or more inputs or controls for receiving and providing data.

In one embodiment, input/output interface 315 may be configured to receive a first correction code for a plurality of data fragments that are stored in a plurality of storage nodes. In one embodiment, the first correction code is a Reed-Solomon code that has a data symbol for each of the plurality of storage nodes and is represented as a polynomial over a first finite field with a first subpacketization size. As stated above, in one embodiment, a finite field has a property such that calculations performed using one or more elements of the field always result in an element having a value that is within the field.

According to one embodiment, the repair module 320 may be coupled to the input/output interface 315. In this embodiment, the repair module 320 may be configured to construct a second correction code in response to at least one unavailable storage node of the plurality of storage nodes. The second correction code is represented as a second polynomial over a second finite field and has an increased subpacketization size relative to the first polynomial. In one embodiment, the second correction code is a new Reed-Solomon code. As stated above, the unavailability may be due to an erasure error in one of the plurality of data fragments. An erasure error may occur if a storage location of a particular symbol included in one of the data fragments is unknown. The repair module 320 may construct a second correction code using one or more operations discussed relative to process 200 of FIG. 2.

In one embodiment, the repair module 320 may be configured to perform erasure repair in the unavailable storage node using the second correction code. In one embodiment, the second correction code is applied to available data fragments of the plurality of data fragments for erasure repair. The erasure error utilizes at least one coset of a multiplicative group of the second finite field. The repair module 320 may perform erasure repair using one or more operations discussed relative to process 200 of FIG. 2. In yet another embodiment, repair module 320 may be configured to output a corrected data fragment based on the erasure repair. In one embodiment, as stated above, errors in one or more of the plurality of data fragments are corrected and the data fragments are restored in their entirety such that all data fragments stored in the storage nodes are accessible and known.

Preliminaries

In this section, a review of linear repair scheme of RS code and a basic lemma used in our proposed schemes is provided.

The Reed-Solomon code RS (A, k) over $\mathbb{F}=GF(q^l)$ of dimension k with n evaluation points $A=\{\alpha 1, \alpha 2, \ldots, \alpha n\} \subseteq F$ is defined as $$RS(A,k)=\{(f((\alpha_1),f(\alpha_2), \ldots, f(\alpha_n))f \in \mathbb{F}[x], \deg(f) \leq k-1\},$$

where deg( ) denotes the degree of a polynomial, $f(x)=u_0+u_1x+u_2x^2+\ldots+u_{k-1}x^{k-1}$ and $u_i \in \mathbb{F}$, i=0, 1, ..., k-1 are the messages. Every evaluation symbol f ($\alpha$), $\alpha \in A$, is called a code word symbol or a storage node. The sub-packetization size is defined as l', and $r \triangleq n-k$ denotes the number of parity symbols.

Assume e nodes fail, $e \leq n-k$, and we want to recover them. The number of helper nodes are denoted by d. The amount of information transmitted from the helper nodes is defined as the repair bandwidth b, measured in the number of symbols over GF(q). All the remaining n-e=d nodes are assumed to be the helper nodes unless stated otherwise. We define the normalized repair bandwidth as $$\frac{b}{\ell d},$$

which is the average fraction of information transmitted from each the minimum storage regenerating (MSR) bound for the bandwidth is $$b \geq \frac{e\ell d}{d-k+e}. \quad (2)$$

As mentioned before, codes achieving the MSR bound require large sub-packetization sizes. In this section, we focus on the single erasure case.

Assume $B \leq F$, namely, B is a subfield of F. A linear repair scheme requires some symbols of the subfield B to be transmitted from each helper node. If the symbols from the same helper node are linearly dependent, the repair bandwidth decreases. In particular, the scheme uses dual code to compute the failed node and uses trace function to obtain the transmitted subfield symbols, as detailed below. Assume $f(\alpha^*)$ fails for some $\alpha^* \in A$. For any polynomial $p(x) \in F[x]$ of which the degree is smaller than r, $(\upsilon 1p(\alpha 1), \upsilon 2p(\alpha 2), \ldots, \upsilon np(\alpha n))$ is a dual codeword of RS (A, k), where $\upsilon i, i \in [n]$ are non-zero constants determined by the set A. We can thus repair the failed node $f(\alpha^*)$ from $$\upsilon_{\alpha^*}p(\alpha^*)f(\alpha^*) = -\sum_{i=1,\alpha_i \neq \alpha^*}^{n} \upsilon_i p(\alpha_i)f(\alpha_i) \quad (3)$$

The summation on the right side means that we add all the i elements from i=1 to i=n except when $\alpha_i \neq \alpha^*$.

The trace function from F onto B is defined as $$tr \mathbb{F}/\mathbb{B}(\beta)+\beta+\beta^q+\ldots+\beta^{q^{j-1}}, \quad (4)$$

where $\beta \in F$, B=GF(q) is called the base field, and q is a power of a prime number. It is a linear mapping from F to B and satisfies $$tr \mathbb{F}/\mathbb{B}(\alpha\beta)=\alpha tr \mathbb{F}/\mathbb{B}(\beta) \quad (5)$$

for all $\alpha \in B$.

We define the rank $rank_B(\{\gamma 1, \gamma 2, \ldots, \gamma i\})$ to be the cardinality of a maximal subset of $\{\gamma 1, \gamma 2, \ldots, \gamma i\}$ that is linearly independent over B. For example, for B=GF(2) and $\alpha \in /B, rankB(\{1, \alpha, 1+a\})=2$ because the subset $\{1, \alpha\}$ is the maximal subset that is linearly independent over B and the cardinality of the subset is 2.

Assume we use polynomials $p_j$ (x), j⌐[l] to generate different dual codewords, called repair polynomials. Combining the trace function and the dual code, we have $$tr_{\mathbb{F}/\mathbb{B}}(\upsilon_{\alpha^*}p_j(\alpha^*)f(\alpha^*)) = -\sum_{i=1,\alpha_i \neq \alpha^*}^{n} tr_{\mathbb{F}/\mathbb{B}}(\upsilon_i p_j(\alpha_i)f(\alpha_i)). \quad (6)$$

In a repair scheme, the helper f($\alpha$i)transmits $$\{tr \mathbb{F}/\mathbb{B}(\upsilon_i p_j(\alpha_i)f(\alpha_i)); j \in [l]\}. \quad (7)$$

TABLE 1 shows a comparison of different schemes for single erasure. When a=1, the scheme is one coset. When a=1, the scheme in multiple cosets.

TABLE I

| | repair bandwith | code length | restrictions |
|---|---|---|---|
| Schemes in [6], [7] | (n − 1(ℓ − s) | n ≤ $q^\ell$ | $q^s \leq r$ |
| Scheme in [16] | $< \frac{\ell}{r}(n+1)$ | n = $\log_r \ell$ | |
| Scheme in [17] | $\frac{\ell}{r}(n-1)$ | $n^n \approx \ell$ | |
| Our scheme in one coset | $\leq \frac{\ell}{a}(n-1)(a-s)$ | n ≤ ($q^a$ − 1) | $q^s \leq r, a\|\ell$ |
| Our scheme in two cosets | $< (n-1)\frac{\ell+a}{2}$ | n ≤ 2($q^a$ − 1) | $\frac{\ell}{r} \leq a, a \| \ell$ |

TABLE I-continued

| | repair bandwith | code length | restrictions |
|---|---|---|---|
| Our scheme in multiple cosets 1 | $< \frac{\ell}{r}(n+1+(r-1)(q^a-2))$ | $n \leq (q^a-1)m$ | $\ell/a = r^m$ for some integer m |
| Our scheme in multiple cosets 2 | $\frac{\ell}{r}(n-1+(r-1)(q^a-2))$ | $n \leq (q^a-1)m$ | $\ell/a \approx m^m$ for some integer m |

TABLE II

| | repair bandwidth | code length | restrictions |
|---|---|---|---|
| Scheme 1 in [19] | $\leq (n-e)e - \frac{e(e-1)(q-1)}{2}$ | $n \leq q^\ell$ | $q^{t-1} \leq r, e < \sqrt{\log_q n}$ |
| Scheme 2 in [19] | $\leq \min_{e' \geq e}\left((n-e')\left(\ell - \left\lfloor \log_q\left(\frac{n-k+e'-1}{2e'-1}\right)\right\rfloor\right)\right)$ | $n \leq q^\ell$ | |
| Scheme in [22] | $\frac{ed\ell}{d-k+e}$ | $n^n \approx \ell$ | |
| Our scheme for multiple erasures in one coset | $\leq \frac{c\ell}{a}(n-e)(a-s)$ | $n \leq (q^a-1)$ | $q^s \leq r, a \mid \ell, e < \frac{1}{a-s}\sqrt{\log_q n}$ |
| Our scheme for multiple erasures in multiple coset | $\frac{c\ell}{n-k}(n-e+(n-k+e)(q^a-2))$ | $n \leq (q^a-1)m$ | $\ell/a \approx m^m$ for some integer m |

TABLE II shows a comparison for multiple erasures. When a=1 and s=1, the scheme is one coset. When a=1, the scheme in multiple cosets.

Supposing $\{v_{\alpha^*}p_1(\alpha^*), v_{\alpha^*}p_2, \ldots, v_{\alpha^*}p_\ell(\alpha^*)\}$ is a basis for F over B, and assume $\{\mu 1, \mu 2, \ldots, \mu^\ell\}$ is its dual basis. Then, $f(\alpha^*)$ can be repaired by $$f(\alpha^*) = \sum_{j=1}^{\ell} \mu_j tr_{F/B}(v_{\alpha^*}p_j(\alpha^*)f(\alpha^*)). \quad (8)$$

Since $v\alpha^*$ is a non-zero constant, we equivalently suppose that $\{p1(\alpha^*), \ldots, p^\ell(\alpha^*)\}$ is a basis.

In fact, by any linear repair scheme of RS code for the failed node $f(\alpha^*)$ is equivalent to choosing $p_j(x)$, $j \in [l]$, with degree smaller than r, such that $\{p_1(\alpha^*), \ldots, p_\ell(\alpha^*)\}$ forms a basis for F over B. We call this the full rank condition:

$$\text{rank } \mathbb{B}(\{p_1(\alpha^*), p_2(\alpha^*), \ldots, p_\ell(\alpha^*)\}) = l. \quad (9)$$

The repair bandwidth can be calculated from (7) and by noting that $v_i f(\alpha_i)$ is a constant:

$$b = \sum_{\alpha \in A, \alpha \neq \alpha^*} rank_B(\{p_1(\alpha), p_2(\alpha), \ldots, p_\ell(\alpha)\}). \quad (10)$$

We call this the repair bandwidth condition.

The goal of a good RS code construction and its repair scheme is to choose appropriate evaluation points A and polynomials $p_j(x)$, $j \in [l]$, that can reduce the repair bandwidth in (10) while satisfying (9).

The following lemma is due to the structure of the multiplicative group of F, which will be used for finding Lemma 1. Assume $\mathbb{E} \leq \mathbb{F} = GF(q^l)$, then $\mathbb{F}^*$ can be partitioned to $$t \triangleq \frac{q^l - 1}{|\mathbb{E}| - 1}$$

cosets: $\{\mathbb{E}^*, \beta\mathbb{E}, \beta^2\mathbb{E}^*, \ldots, \beta^{t-1}\mathbb{E}^*\}$, where $\beta$ is a primitive element of $\mathbb{F}$.

Proof: The $q^l - 1$ elements in $\mathbb{F}^*$ are $\{1, \beta, \beta^2, \ldots, \beta^{q^l-2}\}$ and $\mathbb{E}^* \subseteq \mathbb{F}^*$. Assume that t is the smallest nonzero number that satisfies $\beta^t \in \mathbb{E}^*$, then we know that $\beta^k \in \mathbb{E}^*$ if and only if $t|k$. Also, $\beta^{k_1} \neq \beta^{k_2}$ when $k_1 \neq k_2$ and $k_1, k_2 < q^l - 2$. Since there are only $|\mathbb{E}| - 1$ nonzero distinct elements in $\mathbb{E}^*$ and $\beta^{q^l-1} = 1$, we have $$t = \frac{q^l - 1}{|\mathbb{E}| - 1}$$

and the t cosets are $\mathbb{E}^* = \{1, \beta^t, \beta^{2t}, \ldots, \beta^{(|\mathbb{E}|-2)t}\}$, $\beta\mathbb{E}^* = \{\beta, \beta^{t+1}, \beta^{2t+1}, \ldots, \beta^{(|\mathbb{E}|-2)t+1}\}, \ldots, \beta^{t-1}\mathbb{E}^* = \{\beta^{t-1}, \beta^{2t-1}, \beta^{3t+1}, \ldots, \beta^{(|\mathbb{E}|-1)t-1)}\}$.

Reed-Solomon Repair Schemes for Single Erasure.

Three RS repair schemes for single erasure are provided. Evaluation points are part of one coset, two cosets and multiple cosets for a single erasure. From these constructions, embodiments can achieve different points on the tradeoff between the sub-packetization size and normalized repair bandwidth.

Processes may be based on schemes at employ:
i) taking an original RS code and constructing a new code over a larger finite field—thus the sub-packetization of l is increased.
ii) for the schemes using one and two cosets, the code parameters n, k are kept the same as the original code. Hence, for given n, r=n−k, the sub-packetization size l increases, but we show that the normalized repair bandwidth remains the same, and iii) For the scheme using multiple cosets, the code length n is increased and the redundancy r is fixed. Moreover, the code length n grows faster than the sub-packetization size l. Therefore, for fixed n, r, the sub-packetization l decreases, and we show that the normalized repair bandwidth is only slightly larger than the original code.

A. Schemes in One Coset

Assume $E=GF(q^a)$ is a subfield of $F=GF(q^l)$ and $B=GF(q)$ is the base field, where q is a prime number. The evaluation points of the code over F that we construct are part of one coset in Lemma 1.

We first present the following lemma about the basis.

Lemma 2. Assume $\{\xi_1, \xi_2, \ldots, \xi_l\}$ is a basis for $\mathbb{F}=GF(q^l)$ over $\mathbb{B}=GF(q)$, then $\{\xi_1^{q^s}, \xi_2^{q^s}, \ldots, \xi_l^{q^s}\}$, $s \in [l]$ is also a basis.

Proof Assume $\{\xi_1^{q^s}, \xi_2^{q^s}, \ldots, \xi_l^{q^s}\}$, $s \in [l]$ is not a basis for $\mathbb{F}$ over $\mathbb{B}$, then there exist nonzero $(\alpha_1, \alpha_2, \ldots, \alpha_l)$, $\alpha_i \in \mathbb{B}$, $i \in [l]$, that satisfy $$\alpha_1 \xi_1^{q^s} + \alpha_2 \xi_2^{q^s} + \ldots + \alpha_\ell \xi_\ell^{q^s} = 0 = (\alpha_1 \xi_1 + \alpha_2 \xi_2 + \ldots + \alpha_\ell \xi_\ell)^{q^s}, \quad (11)$$

which is in contradiction to the assumption that $\{\xi_1, \xi_2, \ldots, \xi_l\}$ is a basis for $\mathbb{F}$ over $\mathbb{B}$. ∎

The following theorem shows the repair scheme using one coset for the evaluation points.

Theorem 1. There exists an RS(n,k) code over $\mathbb{F}=GF(q^l)$ with repair bandwidth $$b \leq \frac{\ell}{a}(n-1)(a-s)$$

symbols over $\mathbb{B}=GF(q)$, where q is a prime number and a, s satisfy $n < q^a$, $q^s \leq n-k$, all.

Proof Assume a field $\mathbb{F}=GF(q^l)$ is extended from $\mathbb{E}=GF(q^a)$, all, and β is a primitive element of $\mathbb{F}$. We focus on the code RS(A, k) of dimension k over $\mathbb{F}$ with evaluation points $A=\{\alpha_1, \beta_2, \ldots, \alpha_n\} \subseteq \beta^m \mathbb{E}^*$ for some $$0 \leq m < \frac{q^l - 1}{q^a - 1},$$

which is one of the cosets in Lemma 1.

The base field is $B=GF(q)$ and (6) is used to repair the failed node $f(\alpha^*)$.

Construction I: For s=a−1, we choose $$p_j(x) = \frac{tr_{\mathbb{E}/\mathbb{B}}\left(\xi_j\left(\frac{x}{\beta^m} - \frac{\alpha^*}{\beta^m}\right)\right)}{\frac{x}{\beta^m} - \frac{\alpha^*}{\beta^m}}, j \in [a], \quad (12)$$

Where $\{\xi 1, \xi 2, \ldots, \xi a\}$ is a basis for E over B. The degree of pj(x) is smaller than r since $q^s \leq r$. When $x=\alpha^*$, by (4) we have $$p_j(\alpha^*) = \xi_j. \quad (13)$$

So the polynomials satisfy $$\text{rank}_{\mathbb{B}}(\{p_1(\alpha^*), p_2(\alpha^*), \ldots, p_a(\alpha^*)\}) = a. \quad (14)$$

When $x \neq \alpha^*$, since $$tr_{\mathbb{E}/\mathbb{B}}\left(\xi_j\left(\frac{x}{\beta^m} - \frac{\alpha^*}{\beta^m}\right)\right) \in \mathbb{B}, \text{ and } \frac{x}{\beta^m} - \frac{\alpha^*}{\beta^m}$$

is a constant independent of j, we have $$\text{rank } \mathbb{B}(\{p_1(x), p_2(x), \ldots, p_a(x)\}) = 1. \quad (15)$$

Let $\{\eta_1, \eta_2, \eta_3, \ldots, \eta_{l/a}\}$ be a basis for $\mathbb{F}$ over $\mathbb{E}$, the l repair polynomials are chosen as $$\{\eta_1 p_j(x), \eta_2 p_j(x), \ldots, \eta_{l/a} p_j(x): j \in [a]\}. \quad (16)$$

Since $p_j(x) \in \mathbb{E}$, we can conclude that $$rank_{\mathbb{B}}(\{\eta_1 p_j(\alpha^*), \eta_2 p_j(\alpha^*), \ldots, \eta_{\ell/a} p_j(\alpha^*): j \in [a]\}) = \quad (17)$$

$$\frac{\ell}{a} rank_{\mathbb{B}}(\{p_1(\alpha^*), p_2(\alpha^*), \ldots, p_a(\alpha^*)\}) = \ell$$

satisfies the full rank condition, and for $x \neq \alpha^*$ $$rank_{\mathbb{B}}(\{\eta_1 p_j(x), \eta_2 p_j(x), \ldots, \eta_{\ell/a} p_j(x): j \in [a]\}) = \quad (18)$$

$$\frac{\ell}{a} rank_{\mathbb{B}}(\{p_1(x), p_2(x), \ldots, p_a(x)\}) = \frac{\ell}{a}.$$

From (10) we can calculate the repair bandwidth $$b = \frac{\ell}{a}(n-1). \quad (19)$$

Construction II: For $s \leq a-1$, $$p_j(x) = \xi_j \prod_{i=1}^{q^s-1}\left(\frac{x}{\beta^m} - \left(\frac{\alpha^*}{\beta^m} - w_i^{-1}\xi_j\right)\right), j \in [a], \quad (20)$$

where $\{\xi_1, \xi_2, \ldots, \xi_a\}$ is a basis for $\mathbb{E}$ over $\mathbb{B}$, and $W=\{w_0=0, w_1, w_2, \ldots, w_{q^s-1}\}$ is an s-dimensional subspace in $\mathbb{E}$, $s < a$, $q^s \leq r$. It is easy to check that the degree of $p_j(x)$ is smaller than r since $q^s \leq r$. When $x=\alpha^*$, we have $$p_j(\alpha^*) = \xi_j^{q^s} \prod_{i=1}^{q^s-1} w_i^{-1}. \quad (21)$$

Since $$\prod_{i=1}^{q^s-1} w_i^{-1}$$

is a constant, from Lemma 2 we have $$\text{rank } \mathbb{B}(\{p_1(\alpha^*), p_2(\alpha^*), \ldots, p_a(\alpha^*)\}) = a. \quad (22)$$

For $x \neq \alpha^*$, set $$x' = \frac{\alpha^*}{\beta^m} - \frac{x}{\beta^m} \in \mathbb{E},$$

we have $$p_j(x) = \xi_j \prod_{i=1}^{q^s-1}\left(\frac{x}{\beta^m} - \left(\frac{\alpha^*}{\beta^m} - w_i^{-1}\xi_j\right)\right) \quad (23)$$

$$= \xi_j \prod_{i=1}^{q^s-1}(w_i^{-1}\xi_j - x')$$

$$= \xi_j \prod_{i=1}^{q^s-1}(w_i^{-1}x')\prod_{i=1}^{q^s-1}(\xi_j/x' - w_i)$$

$$= (x')^{q^s}\prod_{i=1}^{q^s-1}(w_i^{-1})\prod_{i=0}^{q^s-1}(\xi_j/x' - w_i).$$

Then, $$g(y) = \prod_{i=0}^{q^s-1}(y - w_i),$$

is a linear mapping from E to itself with dimension a-s over B. Since $$(x')^{q^s}\prod_{i=1}^{q^s-1}(w_i^{-1})$$

is a constant independent of j, we have $$\text{rank}_{\mathbb{B}}(\{p_1(x), p_2(x), \ldots, p_a(x)\}) \le a-s. \quad (24)$$

Let $\{\eta_1, \eta_2, \eta_3, \ldots, \eta_{l/a}\}$ be a basis for $\mathbb{F}$ over $\mathbb{E}$, then the l polynomials are chosen as $\{\eta_1 p_j(x), \eta_2 p_j(x), \ldots, \eta_{l/a}p_j(x), j \in [a]\}$. From (21) and (23) we know that $p_j(x) \in \mathbb{E}$ so we can conclude that $$\text{rank}_{\mathbb{B}}(\{\eta_1 p_j(\alpha^*), \eta_2 p_j(\alpha^*), \ldots, \eta_{l/a}p_j(\alpha^*): j \in [a]\}) = \quad (25)$$

$$\frac{\ell}{a}\text{rank}_{\mathbb{B}}(\{p_1(\alpha^*), p_2(\alpha^*), \ldots, p_a(\alpha^*)\}) = \ell$$

satisfies (9), and for $x \ne \alpha^*$ $$\text{rank}_{\mathbb{B}}(\{\eta_1 p_j(x), \eta_2 p_j(x), \ldots, \eta_{l/a}p_j(x): j \in [a]\}) = \quad (26)$$

$$\frac{\ell}{a}\text{rank}_{\mathbb{B}}(\{p_1(x), p_2(x), \ldots, p_a(x)\}) \le \frac{\ell}{a}(a-s).$$

Now from (10) we can calculate the repair bandwidth $$b \le \frac{\ell}{a}(n-1)(a-s). \quad (27)$$

Rather than directly using existing schemes, the polynomials (12) and (20) uses a set of basis $\{\xi_1, \xi_2, \ldots, \xi_a\}$ from E to B. Moreover, each polynomial is multiplied with the basis for F over E to satisfy the full rank condition. In this case, our embodiments and schemes significantly reduce the repair bandwidth when the code length remains the same.

Our evaluation points are in a coset rather than the entire field F. It should be noted that a here can be an arbitrary number that divides l and when a=1. Note that the normalized repair bandwidth $$\frac{b}{\ell(n-1)}$$

decreases as a decreases. Therefore, our scheme outperforms existing schemes when applied to the case of $l > \log_q n$.

Example 1. Assume q=2, l=9, a=3 and E={0, 1, $\alpha$, $\alpha 2, \ldots, \alpha 6$}. Let A=E*, n=7, k=5 so r=n-k=2. Choose s=$\log_2$ r=1 and W={0, 1} in Construction II. Then, we have pj(x)=$\xi$j(x-$\alpha$*+$\xi$j). Let {$\xi$1, $\xi$2, $\xi$3} be {1, $\alpha$, $\alpha$2}. It is easy to check that rankB({p1($\alpha$*), p2($\alpha$*), p3($\alpha$*)})=3 and rankB ({p1(x), p2(x), p3(x)})=2 for x=6 $\alpha$*. Therefore the repair bandwidth is b=36 bits as suggested in Theorem 1. For the same (n, k, l), the repair bandwidth in prior schemes may be 48 bits. For another example, consider RS (14, 10) code used in Facebook, we have repair bandwidth of 52 bits for l=8, while the prior scheme requires 60 bits and the naive scheme requires 80 bits.

According to one embodiment, the scheme constructs a scalar code. This scalar code may be the first example of such a scalar code in the art.

B. Schemes in Two Cosets

According to one embodiment, the scheme can include evaluation points chosen from two cosets. In this scheme, polynomials are chosen that have full rank when evaluated at the coset containing the failed node, and rank 1 when evaluated at the other coset.

Theorem 2. There exists an RS(n, k) code over $\mathbb{F} = GF(q^l)$ with repair bandwidth $$b < (n-1)\frac{\ell+a}{2}$$

symbols over $\mathbb{B} = GF(q)$, where q is a prime number an a satisfies $$n \le 2(q^a - 1), a | \ell, \frac{\ell}{a} \le n-k.$$

Proof: Assume a field $\mathbb{F} = GF(q^l)$ is extended from $\mathbb{E} = GF(q^a)$ and $\beta$ is the primitive element of $\mathbb{F}$. We focus on the code RS(A, k) over $\mathbb{F}$ of dimension k with evaluation points A consisting of n/2 points from $\beta^{m_1}\mathbb{E}^*$ and n/2 points from $\beta^{m_2}\mathbb{E}$, $$0 \le m_1 < m_2 \le \frac{q^\ell - 1}{q^a - 1} \text{ and } m_2 - m_1 = q^s, s \in \left\{0, 1, \ldots, \frac{\ell}{a}\right\}.$$

In this case we view $\mathbb{E}$ as the base field and repair the failed node $f(\alpha^*)$ by $$tr_{\mathbb{F}/\mathbb{E}}(v_{\alpha^*}p_j(\alpha^*)f(\alpha^*)) = -\sum_{i=1, \alpha_i \ne \alpha^*}^{n} tr_{\mathbb{F}/\mathbb{E}}(v_i p_j(\alpha_i)f(\alpha_i)). \quad (28)$$

Inspired by [6, Theorem 10], for $$j \in \left[\frac{\ell}{a}\right],$$

we choose $$p_j(x) = \begin{cases} \left(\frac{x}{\beta^{m_2}}\right)^{j-1}, & \text{if } \alpha^* \in \beta^{m_1}\mathbb{E}^*, \\ \left(\frac{x}{\beta^{m_1}}\right)^{j-1}, & \text{if } \alpha^* \in \beta^{m_2}\mathbb{E}^*, \end{cases} \quad (29)$$

The degree of $p_j(x)$ is smaller than $r$ when $$\frac{\ell}{a} \leq r.$$

Then, we check the rank in each case.

When $\alpha^* \in \beta^{m_2} \mathbb{E}^*$, if $x = \beta^{m_1}\gamma \in \beta^{m_1} \mathbb{E}^*$, for some $\gamma \in \mathbb{E}^*$, $$p_j(x) = \left(\frac{x}{\beta^{m_1}}\right)^{j-1} = \gamma^{j-1}, \quad (30)$$

so $$\text{rank}_\mathbb{E}\left(\{p_1(x), p_2(x), \ldots, p_{\frac{\ell}{a}}(x)\}\right) = 1. \quad (31)$$

If $x = \beta^{m_2}\gamma \in \beta^{m_2} \mathbb{E}^*$, for some $\gamma \in \mathbb{E}^*$, $$p_j(x) = \left(\frac{x}{\beta^{m_1}}\right)^{j-1} = (\beta^{m_2-m_1})^{j-1}\gamma^{j-1}. \quad (32)$$

Since $m_2 - m_1 = q^s$ and $$\{1, \beta, \beta^2, \ldots, \beta^{\frac{\ell}{a}-1}\}$$

is the polynomial basis for $\mathbb{F}$ over $\mathbb{E}$, from Lemma 2 we know that $$\text{rank}_\mathbb{E}\left(\{p_1(x), p_2(x), \ldots, p_{\frac{\ell}{a}}(x)\}\right) = \frac{\ell}{a}. \quad (33)$$

When $\alpha^* \in \beta^{m_1} \mathbb{E}^*$, if $x = \beta^{m_1}\gamma \in \beta^{m_1} \mathbb{E}^*$, for some $\gamma \in \mathbb{E}^*$, $$\begin{aligned} p_j(x) &= \left(\frac{x}{\beta^{m_2}}\right)^{j-1} \\ &= (\beta^{m_1-m_2})^{j-1}\gamma^{j-1} \\ &= (\beta^{m_1-m_2})^{1-\frac{\ell}{a}}(\beta^{m_2-m_1})^{\frac{\ell}{a}-j}\gamma^{j-1}. \end{aligned} \quad (34)$$

Since $$(\beta^{m_2-m_1})^{1-\frac{\ell}{a}}$$

is a constant, from Lemma 2 we know that $$\text{rank}_\mathbb{E}\left(\{p_1(x), p_2(x), \ldots, p_{\frac{\ell}{a}}(x)\}\right) = \frac{\ell}{a}. \quad (35)$$

If $x = \beta^{m_2}\gamma \in \beta^{m_2} \mathbb{E}^*$, for some $\gamma \in \mathbb{E}^*$, $$p_j(x) = \left(\frac{x}{\beta^{m_2}}\right)^{j-1} = \gamma^{j-1}, \quad (36)$$

so $$\text{rank}_\mathbb{E}\left(\{p_1(x), p_2(x), \ldots, p_{\frac{\ell}{a}}(x)\}\right) = 1. \quad (37)$$

Therefore, $$\left\{p_j(\alpha^*), j \in \left[\frac{\ell}{a}\right]\right\}$$

has full rank over E, for any evaluation point $\alpha_* \in A$. For x from the coset containing $\alpha_*$, the polynomials have rank $l/a$, and for x from the other coset, the polynomials have rank 1. Then, the repair bandwidth in symbols over B can be calculated from (10) as $$\begin{aligned} b &= \frac{\ell}{a}\left(\frac{n}{2}-1\right)\log_q|\mathbb{E}| + \frac{n}{2}\log_q|\mathbb{E}| \\ &= (n-1)\frac{\ell+a}{2} - \frac{\ell-a}{2} \\ &< (n-1)\frac{\ell+a}{2}. \end{aligned} \quad (38)$$

Example 2. Take the RS (14, 11) code over $F=GF(2^{12})$ for example. Let β be the primitive element in F, a=4, s=l/a=3 and A=E*∪βE*. Assume $\alpha^* \in \beta\mathbb{E}^*$, then {pj (x), j∈[3]} is the set {1, x, x²}. It is easy to check that when x∈βE* the polynomials have full rank and when x∈E* the polynomials have rank 1. The total repair bandwidth is 100 bits. For the same (n, k, l), the repair bandwidth of our scheme in one coset is 117 bits. For prior schemes, which only works for l/a=2, we can only choose a=6 and get the repair bandwidth of 114 bits for the same (n, k, l).

C. Schemes in Multiple Cosets

In the schemes in this subsection, we extend an original code to a new code over a larger field and the evaluation points are chosen from multiple cosets in Lemma 1 to increase the code length. The construction ensures that for fixed n, the sub-packetization size is smaller than the original code. If the original code satisfies several conditions to be discussed soon, the repair bandwidth in the new code is only slightly larger than that of the original code.

Particularly, if the original code is an MSR code, then we can get the new code in a much smaller sub-packetization level with a small extra repair bandwidth. Also, if the original code works for any number of helpers and multiple erasures, the new code works for any number of helpers and multiple erasures, too. We discuss multiple erasures below.

We first prove a lemma regarding the ranks over different base fields, and then describe the new code.

Lemma 3. Let $\mathbb{B}=GF(q)$, $\mathbb{F}'=GF(q^{l'})$, $\mathbb{E}=GF(q^a)$, $\mathbb{F}=GF(q^l)$, $l=al'$. a and l' are relatively prime and q can be any power of a prime number. For any set of $\{\gamma_1, \gamma_2, \ldots, \gamma_{l'}\} \subseteq \mathbb{F}' \leq \mathbb{F}$, we have $$\text{rank}_{\mathbb{E}}(\{\gamma_1, \gamma_2, \ldots, \gamma_{l'}\}) = \text{rank}_{\mathbb{B}}(\{\gamma_1, \gamma_2, \ldots, \gamma_{l'}\}). \quad (39)$$

Proof: Assume $\text{rank}_{\mathbb{B}}(\{\gamma_1, \gamma_2, \ldots, \gamma_{l'}\}) = c$ and with-out loss of generality, $\{\gamma_1, \gamma_2, \ldots, \gamma_c\}$ are linearly independent over $\mathbb{B}$. Then, we can construct $\{\gamma'_{c+1}, \gamma'_{c+2}, \ldots, \gamma'_{l'}\} \subseteq \mathbb{F}'$ to make $\{\gamma_1, \gamma_2, \ldots, \gamma_c, \gamma'_{c+1}, \gamma'_{c+2}, \ldots, \gamma'_{l'}\}$ form a basis for $\mathbb{F}'$ over $\mathbb{B}$.

Assume we get F by adjoining β to B. Then, $\{1, \beta, \beta^2, \ldots, \beta^{n-1}\}$ is a basis for both F over E, and F0over B. So, any symbol y∈F can be presented as a linear combination of $\{1, \beta, \beta^2, \ldots, \beta^{n-1}\}$ with some coefficients in E. Also, there is an invertible linear transformation with coefficients in B between $\{\gamma_1, \gamma_2, \ldots, \gamma_c, \gamma_{c+1}, \gamma_{c+2}, \ldots, \gamma_0''\}$ and $\{1, \beta, \beta^2, \ldots, \beta^{n-1}\}$, because they are a basis for F0over B. Combined with the fact that $\{1, \beta, \beta^2, \ldots, \beta^{n-1}\}$ is also a basis for F over E, we can conclude that any symbol y∈F can be represented as $$y = x_1\gamma_1 + x_2\gamma_2 + \ldots + x_c\gamma_c + x_{c+1}\gamma'_{c+1} + \ldots + x_{l'}\gamma'_{l'} \quad (40)$$

with some coefficients $x_i \in E$, which means that $\{\gamma_1, \gamma_2, \ldots, \gamma_c, \gamma_{0c+1}, y_{0c+2}, \ldots, y_0'\}$ is also a basis for F over E. Then, we have that $\{\gamma_1, \gamma_2, \ldots, \gamma_c\}$ are linearly independent over E, $$\text{rank}_{\mathbb{E}}(\{\gamma_1, \gamma_2, \ldots, \gamma_{l'}\}) \geq c = \text{rank}_{\mathbb{B}}(\{\gamma_1, \gamma_2, \ldots, \gamma_{l'}\}). \quad (41)$$

Since $\mathbb{B} \leq \mathbb{E}$, we also have $$\text{rank}_{\mathbb{E}}(\{\gamma_1, \gamma_2, \ldots, \gamma_{l'}\}) \leq \text{rank}_{\mathbb{B}}(\{\gamma_1, \gamma_2, \ldots, \gamma_{l'}\}). \quad (42)$$

Theorem 3. Assume there exists a RS(n', k') code $\mathscr{E}'$ over $\mathbb{F}'=GF(q^{l'})$ with evaluation points set $A'$. The evaluation points are linearly independent over $B=GF(q)$. The repair bandwidth is $b'$ and the repair polynomials are $p'_j(x)$.

Then, we can construct a new RS(n, k) code E over $\mathbb{F}=GF(q^l)$, $l=al'$ with $n=(q^a-1)n'$, $k=n-n'+k'$ and repair bandwidth of $b=ab'(q^a-1)+(q^a-2)l$: symbols over $B=GF(q)$ if we can find new repair polynomials $p_j(x) \in \mathbb{F}[x]$, $j \in [l']$, with degrees less than n−k that satisfy $$\text{rank}_{\mathbb{E}}(\{p_1(x), p_2(x), \ldots, p_{l'}(x)\}) = \text{rank}_{\mathbb{B}}(\{p'_1(\alpha), p'_2(\alpha), \ldots, p'_{l'}(\alpha)\}) \quad (43)$$

Proof We first prove the case when a and l' are necessarily relatively prime using Lemma 3, the case when a and l' are not relatively prime are proved in Appendix A. Assume the evaluation points of $\mathscr{E}$ are $A'=\{\alpha_1, \alpha_2, \ldots, \alpha_{n'}\}$, then from Lemma 3 we know that they are also linearly independent over $\mathbb{E}$, so there does not exist $\gamma_i, \gamma_j \in \mathbb{E}^*$ that satisfy $\alpha_i \gamma_i = \alpha_j \gamma_j$, which implies that $\{\alpha_1 \mathbb{E}^*, \alpha_2 \mathbb{E}^*, \ldots, \alpha_{n'} \mathbb{E}^*\}$ are distinct cosets. Then, we can extend the evaluation points to be $$A = \{\alpha_1 \mathbb{E}^*, \alpha_2 \mathbb{E}^*, \ldots, \alpha_{n'} \mathbb{E}^*\}. \quad (44)$$

and $n=(q^a-1)n'$. We keep the same redundancy $r=n'-k'$ for the new code so $k=n-r$.

For the new code $\mathscr{E}$, we use $p_j(x) \in \mathbb{F}[x]$, $j \in [l']$ to repair the failed node $f(\alpha^*)$ $$tr_{\mathbb{F}/\mathbb{E}}(v_\alpha * p_j(\alpha^*)f(\alpha^*)) = -\sum_{\alpha \in A, \alpha \neq \alpha^*} tr_{\mathbb{F}/\mathbb{E}}(v_\alpha p_j(\alpha)f(\alpha)). \quad (45)$$

Assume the failed node is $f(\alpha^*)$ and $\alpha^* \in \alpha_i \mathbb{E}^*$. Then, for the node $x \in \alpha_i \mathbb{E}^*$, because the original code satisfies the full rank condition, we have $$\text{rank}_{\mathbb{E}}(\{p_1(x), p_2(x), \ldots, p_{l'}(x)\}) = \text{rank}_{\mathbb{B}}(\{p'_1(\alpha_i), p'_2(\alpha_i), \ldots, p'_{l'}(\alpha_i)\}) = l', \quad (46)$$

then we can recover the failed node with $p_j(x)$, and each helper in the coset containing the failed node transmits l' symbols over $\mathbb{E}$.

For a helper in the other cosets, $x \in \alpha_\epsilon \mathbb{E}^*$, $\epsilon \neq i$, by (43), $$\text{rank}_{\mathbb{E}}(\{p_1(x), p_2(x), \ldots, p_{l'}(x)\}) = \text{rank}_{\mathbb{B}}(\{p'_1(\alpha_\epsilon), p'_2(\alpha_\epsilon), \ldots, p'_{l'}(\alpha_\epsilon)\}), \quad (47)$$

then every helper in these cosets transmits $$\frac{b'}{n'-1}$$

symbols in $\mathbb{E}$ on average.

The repair bandwidth of the new code can be calculated from the repair bandwidth condition (10) as $$b = \frac{b'}{n'-1} \cdot (n'-1)|\mathbb{E}^*| \cdot a + (|\mathbb{E}^*|-1)l' \cdot a \quad (48)$$
$$= ab'(q^a-1) + (q^a-2)l$$

Note that the calculation in (48) and (38) are similar in the sense that a helper in the coset containing the failure naively transmits the entire stored information, and the other helpers use the bandwidth that is the same as the original code. As a special case of Theorem 3, $$b' = \frac{l'}{r}(n'-1)$$

matching the MSR bound (1), we get $$b = \frac{l}{r}(n-1) + \frac{l}{r}(r-1)(q^a-2), \quad (49)$$

where the second term is the extra bandwidth compared to the MSR bound.

Next, we apply Theorem 3 to the near-MSR code and the MSR code.

Theorem 4. There exists an RS(n, k) code over $\mathbb{F}=GF(q^l)$ of which $$n = (q^a-1)\log_r \frac{l}{a}$$

and all, such that the repair bandwidth satisfies $$b < \frac{\ell}{n-k}[n+1+(n-k-1)(q^q-2)],$$

measured in symbols over $\mathbb{B}=GF(q)$ for some prime number q.

Proof We first prove the case when a and l' are relatively prime using Lemma 3, the case when a and l' are not necessarily relatively prime are proved in Appendix A. We use the code in [16] as the original code. The original code is defined in $\mathbb{F}'=GF(q^{l'})$ and $l'=r^{n'}$. The evaluation points are $A'=\{\beta, \beta^r, \beta^{r^2}, \ldots, \beta^{r^{n'-1}}\}$ where $\beta$ is a primitive element of $\mathbb{F}'$.

In the original code, for $c=0, 1, 2, \ldots, l'-1$, we write its r-ary expansion as $c=(c_{n'}c_{n'-1}\ldots c_1)$, where $0 \le c_i \le r-1$ is the i-th digit from the right. Assuming the failed node is $f(\beta^{r^{j-1}})$, the repair polynomials are chosen to be $$p'_j(x)=\beta^c x^s, c_j=0, s=0,1,2,\ldots,r-1, x \in \mathbb{F}'. \quad (50)$$

Here c varies from 0 to l'-1 given that $c_j=0$, and s varies from 0 to r-1. So, we have l' polynomials in total. The subscript j is indexed by c and s, and by a small abuse of the notation, we write $j \in [l']$).

In the new code, let us define $\mathbb{E}=GF(q^a)$ of which a and l' are relatively prime. Adjoining $\beta$ to $\mathbb{E}$, we get $\mathbb{F}=GF(q^l)$, $l=al'$. The new evaluation points are $A=\{\beta \mathbb{E}^*, \beta^r \mathbb{E}^*, \beta^{r^2} \mathbb{E}^*, \ldots, \beta^{r^{n'-1}} \mathbb{E}^*\}$. Since $A'$ is part of the polynomial basis for $\mathbb{F}'$ over $\mathbb{B}$, we know that $\{\beta, \beta^r, \beta^{r^2}, \ldots, \beta^{r^{n'-1}}\}$ are linearly independent over $\mathbb{B}$. Hence, we can apply Lemma 3 and the cosets are distinct, resulting in $$n = |A| = (q^\alpha - 1)\log_r \frac{\ell}{a}.$$

In our new code, let us assume the failed node is $f(\alpha^*)$ and $\alpha^* \in \beta^{r^{j-1}} C$, and we choose the polynomial $p_j(x)$ with the same form as $p'_j(x)$, $$p_j(x)=\beta^c x^s, c_j=0, s=0,1,2,\ldots,r-1, x \in \mathbb{F}. \quad (51)$$

For nodes corresponding to $x=\beta^{r^j}\gamma \in \beta^{r^j}\mathbb{E}^*$, for some $\gamma \in \mathbb{E}^*$, we know that $$p_j(x)=\beta^c x^s=\beta^c(\gamma\beta^{r^j})^s=\gamma^s p'_j(\beta^{r^j}). \quad (52)$$

Since $p'_j(\beta^{r^j}) \in \mathbb{F}'$, from Lemma 3, we have $$rank_\mathbb{E}(\{\gamma^s p'_1(\beta^{r^j}), \gamma^s p'_2(\beta^{r^j}), \ldots, \gamma^s p'_{\ell'}(\beta^{r^j})\}) = \quad (53)$$
$$rank_\mathbb{E}(\{p'_1(\beta^{r^j}), p'_2(\beta^{r^j}), \ldots, p'_{\ell'}(\beta^{r^j})\}) =$$
$$rank_\mathbb{B}(\{p'_1(\beta^{r^j}), p'_2(\beta^{r^j}), \ldots, p'_{\ell'}(\beta^{r^j})\}),$$

which satisfies (43). Since the repair bandwidth of the original code is $$b' < (n'+1)\frac{\ell'}{r},$$

from (48) we can calculate the repair bandwidth as $$b = ab'(q^a-1)+(q^a-2)\ell \quad (54)$$
$$< \frac{\ell}{r}[n+1+(r-1)(q^a-2)],$$

where the second term is the extra bandwidth compared to the original code. ∎

Example 3 We take an RS(4, 2) code in $GF(2^{16})$ as the original code and extend it with $a=3, |E^*|=7$ to an RS(28, 26) code in $GF(2^{48})$ with normalized repair bandwidth of $$\frac{b}{(n-1)\ell} < 0.65.$$

The RS(28, 26) code achieves the normalized repair bandwidth of $$\frac{b}{(n-1)\ell} < 0.54$$

while it requires $l=2.7 \times 10^8$. Our scheme has a much smaller l compared while the repair bandwidth is a bit larger.

In the above theorem, extending a priori scheme to a linearly larger sub-packetization and an exponentially larger code length, which means that for the same code length, we can have a much smaller sub-packetization level.

Next, we show our second realization of the scheme in multiple cosets. Different from the previous constructions, this one allows any number of helpers, $k \le d \le n-1$. The sub-packetization size in the original code of a prior scheme satisfies $l' \approx (n')^{n'}$ when n' grows to infinity, thus in our new code it satisfies $l \approx a(n')^{n'}$ for some integer a.

Theorem 5. Let q be a prime number. There exists an RS(n, k) code over $F=GF(q^l)$ of which $$l = asq_1q_2 \ldots q\frac{n}{q^{a-1}},$$

where $q_i$ is the i-th prime number that satisfies $s|(g_i-1)$, $s=d-k+1$ and a is some integer. d is the number of helpers, $k \le d \le (n-1)$. The average repair bandwidth is $$b = \frac{d\ell}{(n-1)(d-k+1)}[n-1+(d-k)(q^a-2)]$$

measured in symbols over $B=GF(q)$.

Proof: We first prove the case when a and $l'$ are relatively prime using Lemma 3, the case when a and $l'$ are not necessarily relatively prime. We use the code in as the original code, where the number of helpers is d0. We set $n-k=n'-k'$ and calculate the repair bandwidth for d helpers from the original code when $d_j=d-k+k'$. Let us define $F_q(\alpha)$ to be the field obtained by adjoining $\alpha$ to the base field B. Similarly, we define $F_q(\alpha 1, \alpha 2, \ldots, \alpha n)$ for adjoining multiple elements. Let $q_i$ be an element of order qi over B. The code is defined in the field $\mathbb{F}'=GF(q^{l'})=GF(q^{sq_1q_2\ldots,q_{n'}})$, which is the degree-s extension of $Fq(\alpha 1, \alpha 2, \ldots, \alpha n')$. The evaluation points are $A'=\{\alpha 1, \alpha 2, \ldots, \alpha n'\}$.

Assuming the failed node is $f(\alpha i)$ and the helpers are chosen from the set $R^l$, $|R^l|=d^l$, the base field for repair is $\mathbb{F}'_i$, defined as $\mathbb{F}'_i \triangleq \mathbb{F}_q(\alpha_j, j\in[n'], j\neq i)$. The repair polynomials are $\{\eta_t p'_j(\alpha i), t\in[q_i], j \in [s]\}$, where $$p'_j(x) = x^{j-1} g'(x), j \in [s], x \in \mathbb{F}', \quad (55)$$

$$g'(x) = \prod_{\alpha \in A/(R' \cup \{\alpha_i\})} (x - \alpha), x \in \mathbb{F}'. \quad (56)$$

and $\eta t \in \mathbb{F}^l$, $t\in[q_i]$, are constructed in such that $\{\eta tp^j j(\alpha i), t\in[qi], j\in[s]\}$ forms the basis for $F^l$ over $F^l i$. The repair is done using $$tr_{F'/F'_i}(\upsilon_{\alpha_i} \eta_t p'_j(\alpha_i) f'(\alpha_i)) = -\sum_{\epsilon=1,\epsilon\neq i}^{n'} tr_{F'/F'_i}(\upsilon_\epsilon \eta_t p'_j(\alpha_\epsilon) f'(\alpha_\epsilon)). \quad (57)$$

For $x \in R^l \cup \{\alpha_i\}$, $p'j(x)=0$, so no information is transmitted. The original code reaches the MSR repair bandwidth $$b' = \sum_{e\in R'} \text{rank}_{\mathbb{F}'_i}(\{\eta_t p'_j(\alpha_e) : t \in [q_i], j \in [s]\}) \quad (58)$$

$$= \frac{d' \ell'}{d' - k' + 1}.$$

According to one or more embodiments, codes can define $\mathbb{E} = GF(q^a) = \mathbb{F}_q(\alpha_{n+1})$ where a and $1^l$ are relatively prime, and $\alpha^{n+1}$ is an element of order a over B. Adjoining the primitive element of $F^l$ to E, then $\mathbb{F} = GF(q^l)$, $l = al'$. The new code is defined in F. Extending the evaluation points to be $A = \{\alpha_1 \mathbb{E}^*, \alpha_2 \mathbb{E}^*, \ldots, \alpha_{n'} \mathbb{E}\}$ Since $\{\alpha_1, \alpha_2, \ldots, \alpha_{n'}\}$ are linearly independent over B, the Lemma 3 can be applied and cosets are distinct. So, $n=|A|=(q^a-1)n'$. Assuming the failed node is $f(\alpha^*)$ and $\alpha^* \in \alpha_i \mathbb{E}^*$ and the helpers are chosen from the set R, $|R|=d$, the base filed for repairs is $\mathbb{F}_i$ which is defined by $\mathbb{F}_i \triangleq \mathbb{F}_q(\alpha_j, j\in[n+1], j\neq i)$, for $i\in[n]$. The repair polynomials are defined as $\{\eta_t p_j(x), t \in [q_i], j \in [s]\}$, where $$p_j(x) = x^{j-1} g(x), j \in [s], x \in \mathbb{F}, \quad (59)$$

$$g(x) = \prod_{\alpha \in A/(R \cup \{\alpha^*\})} (x - \alpha), x \in \mathbb{F}, \quad (60)$$

and $\eta t$ is the same as that in the original code. Then, we repair the failed node can be repaired by $$tr_{\mathbb{F}/\mathbb{F}_i}(\upsilon_\alpha * \eta_t p_j(\alpha^*) f(\alpha^*)) = -\sum_{\alpha\in A, \alpha\neq\alpha^*} tr_{\mathbb{F}/\mathbb{F}_i}(\upsilon_\alpha \eta_t p_j(\alpha) f(\alpha)). \quad (61)$$

For $x \in \alpha \mathbb{E}^*$, $\alpha \in A'$, we have $$p_j(x) = \gamma^{j-1} \alpha^{j-1} g(x), j \in [s], \quad (62)$$

for some $\gamma \in \mathbb{E}^*$. If $x \in R \cup \{\alpha^*\}$, since $g(x)=0$, no information is transmitted from node x. Next, we consider all other nodes.

For $x = \alpha\gamma$, $\alpha \in A'$, since $g(x)$ is a constant independent of j, $\gamma \in \mathbb{E} \subseteq \mathbb{C} \mathbb{F}_i$ and $\eta_t, \alpha_i \in \mathbb{F}'$ from Lemma 3 we have $$\text{rank}_{\mathbb{F}_i}(\{\eta_t p_1(x), \eta_t p_2(x), \ldots, \eta_t p_s(x) : t \in [q_i]\}) \quad (63)$$

$$= \text{rank}_{\mathbb{F}_i}(\{\eta_t, \eta_t \gamma\alpha, \ldots, \eta_t \gamma^{s-1}\alpha^{s-1} : t \in [q_i]\})$$

$$= \text{rank}_{\mathbb{F}_i}(\{\eta_t, \eta_t\alpha, \ldots, \eta_t\alpha^{s-1} : t \in [q_i]\})$$

$$= \text{rank}_{\mathbb{F}'_i}(\{\eta_t, \eta_t\alpha, \ldots, \eta_t\alpha^{s-1} : t \in [q_i]\})$$

$$= \text{rank}_{\mathbb{F}'_i}(\{\eta_t p'_1(\alpha), \eta_t p'_2(\alpha), \ldots, \eta_t p'_s(\alpha) : t \in [q_i]\}),$$

which satisfies (43).

When $k \leq d < n-1$, assuming the helpers are randomly chosen from all the remaining nodes, the average repair bandwidth for different choices of the helpers can be calculated as $$b = d\left[\frac{b'a}{d'} \cdot \frac{n-1-(q^a-2)}{n-1} + \ell'a \cdot \frac{q^a-2}{n-1}\right] \quad (64)$$

$$= \frac{d\ell}{d-k+1} + \frac{d}{n-1}\frac{\ell}{d-k+1}(d-k)(q^a-2). \quad (65)$$

Here in (64) the second term corresponds to the helpers in the failed node coset, the first term corresponds to the helpers in the other cosets, and in (65) we used $d'-k'=d-k$ In the case of $d=n-1$, the repair bandwidth of the code in Theorem 5 can be directly calculated from (48) as $$b = ab'(q^a - 1) + (q^a - 2)\ell \quad (66)$$

$$= \frac{\ell}{r}(n-1) + \frac{\ell}{r}(r-1)(q^a - 2).$$

In (65) and (66), the second term is the extra repair band-width compared to the original code.

In Theorems 4 and 5, we constructed our schemes by extending previous schemes. However, it should be noted that since we only used the properties of the polynomials $p^l j(x)$, we have no restrictions on the dimensions $k^l$ of the original codes. So, in some special cases, even if $k^l$ is negative and the original codes do not exist, our theorems still hold. Thus, we can provide more feasible points of (n, k) using our schemes. This is illustrated in the example below.

Example 4. Let us take the RS(12, 8) code as an example. We set $q=2$, $s=4$, $q_1=5$, $q_2=9$, $q_3=13$ and $a=7$. Then, $l'=2340$ and $l=16380$. Assuming the failed node is $f(\alpha^*)$ and $\alpha^* \in \alpha_1 C$, then we repair it in $\mathbb{F}_1$ and set the polynomials in (59). We can easily check that when $x \in \alpha_1 C$, $\text{rank}_{\mathbb{F}_1}(\{\eta_t p_1(x), \eta_t p_2(x), \ldots, \eta_t p_s(x) : t\in[5]\})=20$ and when x in other cosets, $\text{rank}_{\mathbb{F}}(\{\eta_t p_1(x), \eta_t p_2(x), \ldots, \eta_t p_s(X) : t\in[5]\})=5$. Therefore, we transmit 100 symbols in $\mathbb{F}_1$, which can be normalized to $$\frac{b}{(n-1)\ell} = 0.4545.$$

As such as tradeoff is provided between l and b.

D. Numerical Evaluations and Discussions

Figure 4:
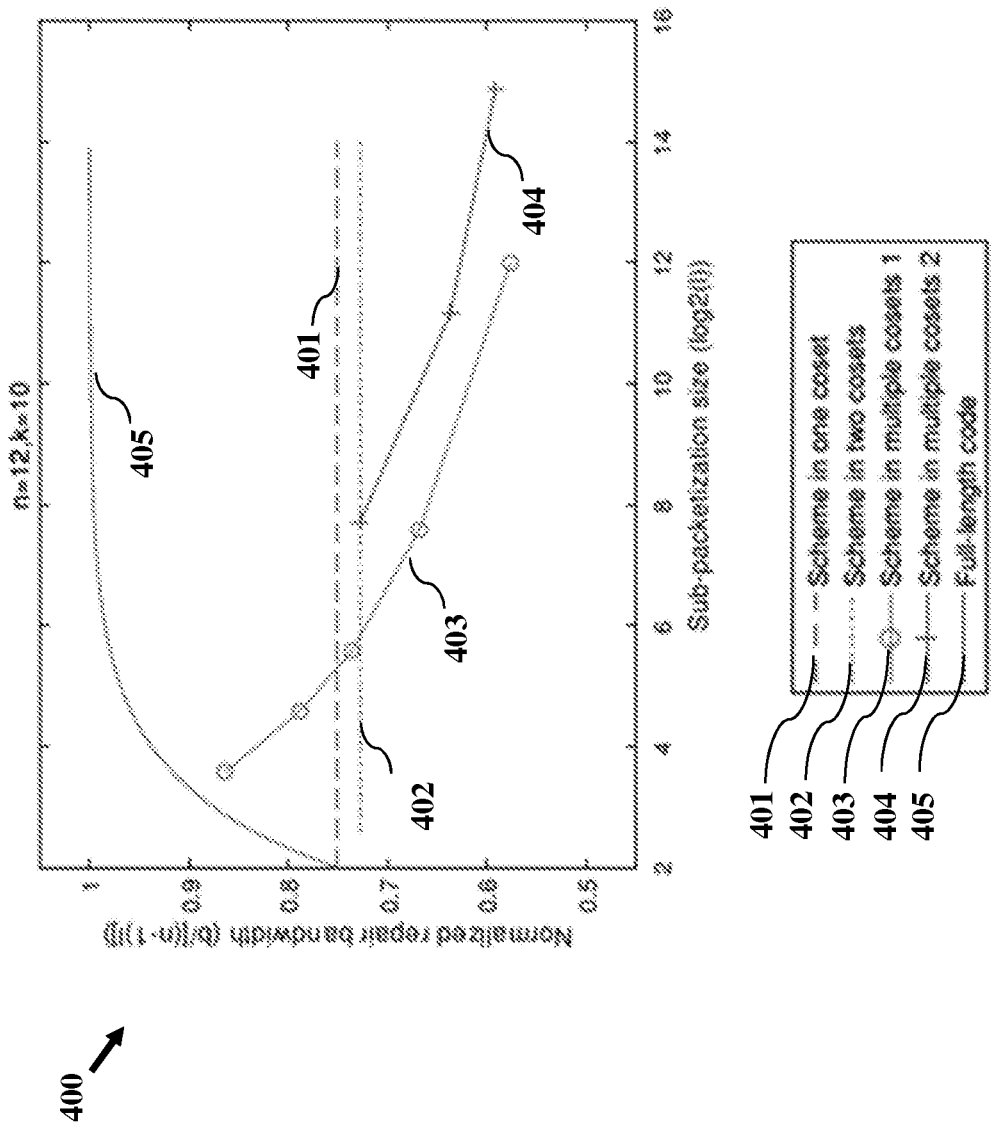
FIG. 4 illustrates a graphical representation showing normalized repair bandwidth values that correspond to various subpacketization sizes as a result of implementing different repair schemes according to one or more embodiments.
Figure 5:
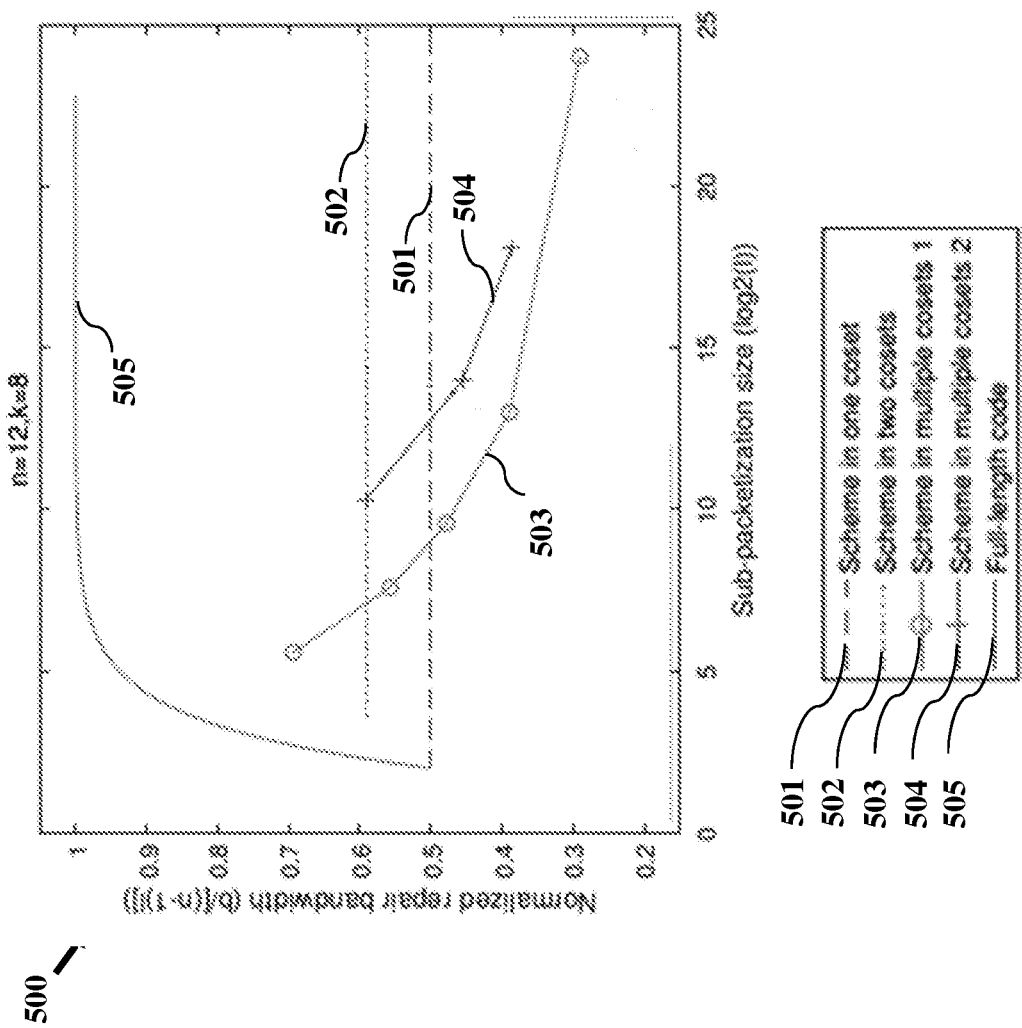
FIG. 5 illustrates a graph representation showing normalized repair bandwidth values that correspond to various subpacketization sizes as a result of implementing different repair schemes according to one or more embodiments.

Advantages of the embodiments may be shown relative to existing proposed schemes. Table I shows the repair bandwidth and the code length of each scheme. For the comparison, FIGS. 4 and 5 show the performance of each scheme when the sub-packetization changes, given (n, k)=1210) and (12, 8), respectively. Considering only n−1 helpers. Two single points $$\left(\log_2(\ell) = 53.5, \frac{b}{(n-1)\ell} = 0.50\right)$$

in RS (12, 10) codes and $$\left(\log_2(\ell) = 64.4, \frac{b}{(n-1)\ell} = 0.25\right)$$

in RS (12,8) codes are not shown in the figures, they can be achieved by both our second realization in multiple cosets. We make the following observations.

FIG. 4 illustrates a graphical representation 400 showing normalized repair bandwidth values that correspond to various subpacketization sizes as a result of implementing different repair schemes according to one or more embodiments described herein. Specifically, FIG. 4 also depicts a relationship between various subpacketization sizes and normalized repair bandwidths upon the implementations of the following repair schemes: one coset scheme 401, two cosets scheme 402, and multiple cosets schemes 403 and 404. FIG. 4 also depicts a Full-length code scheme 405. FIG. 4 also shows a comparison of 3 schemes, q=2, n=12, k=10, r=2, x-axis is the log scale sub-packetization size, y-axis is the normalized repair bandwidth. Moreover, the normalized repair bandwidth values resulting from implementation of different schemes to correct a single erasures in one coset and multiple cosets, and multiple erasures in one coset and multiple cosets are shown in Table III and Table IV.

For a fixed (n, k), we compare the normalized repair bandwidth b/[(n−1)l] in different sub-packetization sizes. At the outset, it is noted that parameter "a" may be changed to adjust sub-packetization size. Regarding a one coset scheme 401 and two cosets scheme 402 depicted in FIG. 4, the parameter a is determined by code length n, and will not be changed by increasing l. In addition, the normalized repair bandwidth will also remain unchanged. Regarding the multiple cosets schemes 403 and 404, the parameter a may be used to adjust the sub-packetization size. When q=2, a=1, the two schemes in multiple cosets can coincides with prior methods. From Theorems 4 and 5 we know that for the two schemes, $$\ell = a \cdot r^{\frac{n}{q^a - 1}} \text{ and } \ell \approx a \cdot \left(\frac{n}{q^a - 1}\right)^{\left(\frac{n}{q^a - 1}\right)},$$

respectively, which means that increasing a will decrease the sub-packetization l.

With respect to the Full-length code scheme 405, the normalized repair bandwidth increases exponentially for sub-packetization sizes ranging from 2 to 6. In addition, the normalized repair bandwidth approaches a value of 1 for sub-packetization sizes ranging from 8 to 16.

FIG. 5 illustrates a graphical representation 500 showing normalized repair bandwidth values that correspond to various subpacketization sizes as a result of implementing different repair schemes. In particular, FIG. 5 depicts a relationship between various subpacketization sizes and normalized repair bandwidths upon the implementations of the following repair schemes: exemplary one coset scheme 501, exemplary two cosets scheme 502, and exemplary multiple cosets schemes 503 and 504. FIG. 5 also depicts an exemplary Full-length code scheme 505. These schemes are implemented according to one or more embodiments described herein. FIG. 5 also illustrates a comparison of 3 schemes, q=2, n=12, k=8, r=4, x-axis is the log scale sub-packetization size, y-axis is the normalized repair bandwidth. Moreover, the normalized repair bandwidth values resulting from implementation of different schemes to correct a single erasures in one coset and multiple cosets, and multiple erasures in one coset and multiple cosets are shown in Table III and Table IV.

A prior scheme can achieve one tradeoff point in FIG. 5, which can be viewed as a special case of our scheme in multiple coset 1 (exemplary multiple coset scheme 503). For fixed n, k, our schemes are better than the full-length code in prior schemes for all l, except when l=4, for which our scheme in one coset (exemplary one coset scheme 501) is identical to the full-length code. While the repair bandwidth of the full-length code grows with l, our schemes in one coset (exemplary one coset scheme 501) and two cosets (exemplary two cosets scheme 502) have a constant normalized bandwidth, and our schemes in multiple cosets (exemplary multiple cosets schemes 503 and 504) have a decreasing normalized bandwidth with l. For small l: the schemes in one coset and two cosets are better than those in multiple cosets; when n=12, k=10, 4≤l≤48, the scheme in two cosets provides the lowest bandwidth; when n=12, k=8, 4≤l≤768, one can show that the scheme in one coset has the smallest bandwidth. For large l the first realization in multiple cosets has better performance than the second realization in multiple cosets, but our second realization works for any number of helpers.

IV. Reed-Solomon Repair Schemes for Multiple Erasures

According to one or more embodiments, definitions of repair schemes for multiple erasures in a MDS code: can include linear repair scheme definition and dual code repair definition. We prove the equivalence of the two definitions. Then, we present two schemes for repairing multiple erasures in Reed-Solomon codes, where the evaluation points are in one coset and multiple cosets, respectively. The manner in which bandwidth is affected in multiple era A. Definitions of the Multiple-Erasure Repair Let us assume a scalar MDS code $\mathscr{E}$ over $\mathbb{F}=GF(q^l)$ has dimension k and code length n. Let a codeword be (C1, C2, . . . Cn). Without loss of generality, we assume {C1, C2, . . . , Ce} are failed, e≤n−k, and we repair them in the base field B=GF(q), where q can be any power of a prime number. We also assume that we use all the remaining d=n−e nodes as helpers. The following definitions are associated with single erasure.

Definition 1. A linear exact repair scheme for multiple erasures consists of the following.

1) A set of queries $Q_t \subseteq \mathbb{F}$ for each helper $C_t$, e+1≤t≤n. The helper $C_t$ replies with $\{\gamma C_t, \gamma \in Q_t\}$.
2) For each failed node $C_i$, i∈[e], a linear repair scheme that computes $$C_i = \sum_{m=1}^{\ell} \lambda_{im}\mu_{im}, \tag{67}$$

where $\{\mu_{i1}, \alpha_{i2}, \ldots, \mu_{il}\}$ is a basis for $\mathbb{F}$ over $\mathbb{B}$ and coefficients $\lambda_{im} \in \mathbb{B}$ are $\mathbb{B}$-linear combinations of the replies $$\lambda_{im} = \sum_{t=e+1}^{n} \sum_{\gamma \in Q_t} \beta_{im\gamma t} \cdot tr_{\mathbb{F}/\mathbb{B}}(\gamma C_t), \quad (68)$$

with the coefficients $\beta_{im\gamma t} \in \mathbb{B}$. The repair bandwidth is $$b = \sum_{t=e+1}^{\ell} \text{rank}_{\mathbb{B}}(Q_t). \quad (69)$$

In the following definition, we consider el dual codewords of E, and index them by $i \in [e]$, $j \in [l]$, denoted as $(C'_{ij1}, C'_{ij2}, \ldots, C'_{ijn})$. Since they are dual codewords, $\Sigma_{t=1}^{n} C_t C'_{ijt} = 0$.

Definition 2. A dual code scheme uses a set of dual codewords $\{(C'_{ij1}, C'_{ij2}, \ldots, C'_{ijn}): i \in [e], j \in [l]\}$ that satisfies:

1) The full rank condition: Vectors $$V_{ij} = (C'_{ij1}, C'_{ij2}, \ldots, C'_{ije}), i \in [e], j \in [l], \quad (70)$$

are linearly independent over $\mathbb{B}$.

2) The repair bandwidth condition:

$$b = \sum_{t=e+1}^{n} \text{rank}_{\mathbb{B}}(\{C'_{ijt}: i \in [e], j \in [\ell]\}). \quad (71)$$

We repair nodes [e] from the linearly independent equations $$\sum_{\upsilon=1}^{e} tr_{\mathbb{F}/\mathbb{B}}(C'_{ij\upsilon} C_{\upsilon}) = -\sum_{t=e+1}^{n} tr_{\mathbb{F}/\mathbb{B}}(C'_{ijt} C_t), i \in [e], j \in [\ell]. \quad (72)$$

Here we use the same condition names as the single erasure case, but in this section, they are defined for multiple erasures.

Theorem 6. Definitions 1 and 2 are equivalent.

The equivalence of Definitions 1 and 2 follows similarly, except that we need to first solve e failed nodes simultaneously and then find out the form of each individual failure (67).

Remark 2. In this paper, we focus on repairing RS code and apply Theorem 6 to RS code. Knowing that with the polynomial $p_{ij}(x) \in \mathbb{F}[x]$ for which the degrees are smaller than n−k, $(\upsilon_1 p_{ij}(\alpha_1), \upsilon_2 p_{ij}(\alpha_2), \ldots, \upsilon_n p_{ij}(\alpha_n))$ is the dual codeword of RS (n, k), where $\upsilon_i$, $i \in [n]$ are non-zero constants determined by the evaluation points set A. So, in RS code, Definition 2 reduces to finding polynomials $p_{ij}(x)$ with degrees smaller than n−k. In what follows we use $p_{ij}(\alpha_t)$ to replace the dual codeword symbol $C'_{ijt}$ in Definition 2 for RS code. One can easily show that the constants $\upsilon_i$, $i \in [n]$ do not affect the ranks in the full rank condition and the repair bandwidth condition.

B. Multiple-Erasure Repair in One Coset

A scheme is provided for multiple erasures in one coset. From Theorem 6, we know that finding the repair scheme for multiple erasures in RS code is equivalent to finding dual codewords (or polynomials) that satisfy the full rank condition and repair bandwidth condition. Given a basis $\{\xi 1, \xi 2, \ldots, \xi^l\}$ for F over B, we define some matrices as below. They are used to help us check the two rank conditions according to Lemmas 4 and 5. Let the evaluation points of an RS code over F be $A = \{\alpha 1, \ldots, \alpha n\}$. Let $p_{ij}(x)$, $i \in [e]$, $j \in [l]$, be polynomials over F, and B a subfield of F. Define $$S_{it} = \begin{bmatrix} tr_{\mathbb{F}/\mathbb{B}}(\xi_1 p_{i1}(\alpha_t)) & \ldots & tr_{\mathbb{F}/\mathbb{B}}(\xi_\ell p_{i1}(\alpha_t)) \\ tr_{\mathbb{F}/\mathbb{B}}(\xi_1 p_{i2}(\alpha_t)) & \ldots & tr_{\mathbb{F}/\mathbb{B}}(\xi_\ell p_{i2}(\alpha_t)) \\ \vdots & \ddots & \vdots \\ tr_{\mathbb{F}/\mathbb{B}}(\xi_1 p_{i\ell}(\alpha_t)) & \ldots & tr_{\mathbb{F}/\mathbb{B}}(\xi_\ell p_{i\ell}(\alpha_t)) \end{bmatrix}, \quad (73)$$

$$S \triangleq \begin{bmatrix} S_{11} & S_{12} & \ldots & S_{1e} \\ S_{21} & S_{22} & \ldots & S_{2e} \\ \vdots & \vdots & \ddots & \vdots \\ S_{e1} & S_{e2} & \ldots & S_{ee} \end{bmatrix}, \quad (74)$$

Lemma 4. The following two statements are equivalent:

1) Vectors $V_{ij} = (p_{ij}(\alpha_1), p_{ij}(\alpha_2), \ldots, p_{ij}(\alpha_e))$, $i \in [e], j \in [l]$ are linearly independent over $\mathbb{B}$.

2) Matrix S in (74) has full rank.

Lemma 5. For $t \in [n]$, consider $S_{it}$ in (73), $$\text{rank}\left(\begin{bmatrix} S_{1t} \\ S_{2t} \\ \vdots \\ S_{et} \end{bmatrix}\right) = rank_{\mathbb{B}}(\{p_{ij}(\alpha_t): i \in [e], j \in [\ell]\}). \quad (75)$$

Theorem 7. Let q be a prime number. There exists an RS(n, k) code over $\mathbb{F} = GF(q^l)$ of which $n < q^a$, $q^s \le r$ and all, such that the repair bandwidth for e erasures is $$b \le \frac{e\ell}{a}(n-e)(a-s)$$

measured in symbols over $\mathbb{B}$, for e satisfying $$a \ge \frac{e(e-1)}{2}(a-s)^2.$$

Proof: We define the code over the field $\mathbb{F} = GF(q^l)$ extended by $\mathbb{E} = GF(q^a)$, where β is the primitive element of $\mathbb{F}$. The evaluation points are chosen to be $A = \{\alpha_1, \alpha_2, \ldots, \alpha_n\} \subseteq \mathbb{E}^*$, which is one of the cosets in Lemma 1. Without loss of generality, we assume the e failed nodes are $\{\alpha_1, \alpha_2, \ldots, \alpha_e\}$. The base field is $\mathbb{B} = GF(q)$. Construction III: We first consider the special case when s=a−1. In this case, inspired by [19, Proposition 1], we choose the polynomials $$p_{ij}(x) = \frac{\delta_i tr_{\mathbb{E}/\mathbb{B}}\left(\frac{\mu_j}{\delta_i}(x-\alpha_i)\right)}{x-a_i}, i \in [e], j \in [a], \quad (76)$$

where $\{\mu_1, \mu_2, \ldots, \alpha_a\}$ is the basis for $\mathbb{E}$ over $\mathbb{B}$, and $\delta_i \in \mathbb{E}$, $i \in [e]$, are coefficients to be determined. From [19, Theorem 3], we know that for $$a > \frac{e(e-1)}{2},$$

there exists $\delta_i$, $i \in [e]$ such that $p_{ij}(x)$ satisfy the full rank condition: the vectors $V_{ij}=(p_{ij}(\alpha_1), p_{ij}(\alpha_2), \ldots, p_{ij}(\alpha_e))$, $i \in [e]$, $j \in [a]$ are linearly independent over B and the repair bandwidth condition:

$$\sum_{t=e+1}^{n} \text{rank}_\mathbb{B}(\{p_{ij}(\alpha_t): i \in [e], j \in [a]\}) = (n-e)e - \frac{e(e-1)(q-1)}{2}. \quad (77)$$

Then, let $\{\eta_1, \eta_2, \ldots, \eta_{l/a}\}$ be a set of basis for $\mathbb{F}$ over $\mathbb{E}$; we have the el polynomials as $\{\eta_w p_{ij}(x): w \in [l/a], i \in [e], j \in [a]\}$. Since $\{\eta_1, \eta_2, \ldots, \eta_{l/a}\}$ are linearly independent over $\mathbb{E}$ and for any $b_{ijw} \in \mathbb{B}$, $b_{ijw} p_{ij}(x) \in \mathbb{E}$, we have $$\sum_{i,j,w} b_{ijw} \eta_w V_{ij} = 0 \iff \sum_{i,j} b_{ijw} V_{ij} = 0, \forall w \in \left[\frac{\ell}{a}\right]. \quad (78)$$

Also, we know that there does not exist nonzero $b_{ijw} \in \mathbb{B}$ that satisfies $\Sigma_{i,j} b_{ijw} V_{ij}=0$, so we have that vectors $\{\eta_w V_{ij}, w \in [l/a], i \in [e], j \in [a]\}$ are also linearly Construction IV: For $s \leq a-1$, consider the polynomials $$p_{ij}(x) = \delta_i^{q^s-1} \mu_j \prod_{\varepsilon=1}^{q^s-1} \left(x - \left(\alpha_i - w_\varepsilon^{-1} \frac{\mu_j}{\delta_i}\right)\right), j \in [a], \quad (80)$$

where $\{\mu_1, \mu_2, \ldots, \mu_a\}$ is the basis for $\mathbb{E}$ over $\mathbb{B}$, $W=\{w_0=0, w_1, w_2, \ldots, w_{q^s-1}\}$ is an s-dimensional subspace in $\mathbb{E}$, $s<a$, $q^s \leq r$, and $\delta_i \in \mathbb{E}$, $i \in [e]$, are coefficients to be determined.

When $x = \alpha_i$, we have $$p_{ij}(\alpha_i) = \mu_i^{q^s} \prod_{\varepsilon=1}^{q^s-1} w_\varepsilon^{-1}. \quad (81)$$

Since $$\sum_{\varepsilon=1}^{q^s-1} w_\varepsilon^{-1}$$

is a constant, from Lemma 2 we have $$\text{rank}_\mathbb{B}(\{p_{i1}(\alpha_i), p_{i2}(\alpha_i), \ldots, p_{ia}(\alpha_i)\}) = a. \quad (82)$$

or $x \neq \alpha_i$, set $x' = \alpha_i - x$, we have $$p_{ij}(x) = \delta_i^{q^s-1} \mu_j \prod_{\varepsilon=1}^{q^s-1} \left(w_\varepsilon^{-1} \frac{\mu_j}{\delta_i} - x'\right) \quad (83)$$

-continued $$= \delta_i^{q^s-1} \mu_j \prod_{\varepsilon=1}^{q^s-1} (w_\varepsilon^{-1} x') \prod_{\varepsilon=1}^{q^s-1} \left(\frac{\mu_j}{\delta_i x'} - w_\varepsilon\right)$$

$$= (\delta_i x')^{q^s} \prod_{\varepsilon=1}^{q^s-1} (w_\varepsilon^{-1}) \prod_{\varepsilon=0}^{q^s-1} \left(\frac{\mu_j}{\delta_i x'} - w_\varepsilon\right).$$

independent over $\mathbb{B}$. So, from Definition 2, we know that we can recover the failed nodes and the repair bandwidth is $$b = \text{rank}_\mathbb{B}(\{\eta_1 p_{ij}(x), \ldots, \eta_{\ell/a} p_{ij}(x): i \in [e], j \in [a]\}) \quad (79)$$

$$= \frac{\ell}{a} \text{rank}_\mathbb{B}(\{p_{ij}(x), i \in [e], j \in [a]\})$$

$$= \frac{\ell}{a} \left[(n-e)e - \frac{e(e-1)(q-1)}{2}\right].$$

As, $$g(y) = \prod_{f=0}^{q^s-1} (y - w_\varepsilon)$$

is a linear mapping from E to itself with dimension a-s over B. Since $$(\delta_i x')^{q^s} \prod_{\varepsilon=1}^{q^s-1} (w_\varepsilon^{-1})$$

is a constant independent of J, we have
$\varepsilon \times = 1$ $$\text{rank}_\mathbb{B}(\{p_{i1}(x), p_{i2}(x), \ldots, p_{ia}(x)\}) \leq a-s, \quad (84)$$

which means that $p_{ij}(x)$ can be written as $$p_{ij}(x) = \delta_i^{q^s} \sum_{\upsilon=1}^{a-s} \rho_{j\upsilon} \lambda_\upsilon, \quad (85)$$

where $\{\lambda_1, \lambda_2, \lambda_{a-s}\}$ are linearly independent over B, $\rho_{j\upsilon} \in \mathbb{B}$, and they are determined by $\delta_i$, $\mu_j$ and $x-\alpha_i$.

From Lemma 4, we know that if the matrix S in (74) has full rank, then we can recover the e erasures. It is difficult to directly discuss the rank of the matrix, but assume that the polynomials above satisfy the following two conditions:
1) $S_{ii}$, $i \in [e]$ are identity matrices.
2) For any fixed $i \in [e]$, $$S_{ti} \cdot S_{ty} = 0_{l \times l}, i > t, y > t. \quad (86)$$

Then, it is easy to see that through Gaussian elimination, e can transform the matrix $S^T$ to an upper triangle block matrix, which has identify matrices in the diagonal. Hence, S has full rank. Here, selecting $\{\xi_1, \xi_2, \ldots, \xi_l\}$ to be the dual basis of $$\left\{\mu_1^{q^s} \prod_{\varepsilon=1}^{q^s-1} w_\varepsilon^{-1}, \mu_2^{q^s} \prod_{\varepsilon=1}^{q^s-1} w_\varepsilon^{-1}, \ldots, \mu_\ell^{q^s} \prod_{\varepsilon=1}^{q^s-1} w_\varepsilon^{-1}\right\}, \text{so} \quad (87)$$

-continued $$tr_{F/B}(\xi_m p_{ij}(\alpha_i)) = \begin{cases} 0, m \neq j, \\ 1, m = j. \end{cases}$$

Therefore, Sii, i∈[e] are identity matrices. We set δ1=1, and recursively choose δi after choosing {δ1, δ2, ..., δi−1} to satisfy (86). Define $\delta'_i = \delta_i^{q^s}$, and $c_{mp}$ to be the (m, p)-th element in Sty for m,p∈[a]. Formula (86) can be written as $$\sum_{m=1}^{a} c_{mp} tr_{F/B}(\xi_m p_{ij}(\alpha_t)) \qquad (88)$$

$$= \sum_{m=1}^{a} c_{mp} \sum_{v=1}^{a-s} b_{jv} tr_{F/B}(\xi_m \delta'_i \lambda_v)$$

$$= 0, \forall j \in [a],$$

where $\lambda_v$, v∈[a−s] are determined by $$\sum_{m=1}^{a} c_{mp} tr_{F/B}(\xi_m p_{ij}(\alpha_t)) \qquad (88)$$

$$= \sum_{m=1}^{a} c_{mp} \sum_{v=1}^{a-s} b_{jv} tr_{F/B}(\xi_m \delta'_i \lambda_v)$$

$$= 0, \forall j \in [a],.$$

Equation (88) is satisfied if $$\sum_{m=1}^{a} c_{mp} tr_{F/B}(\xi_m \delta'_i \lambda_v) = 0, v \in [a-s], p \in [a]. \qquad (89)$$

As a special case of Lemma 5, we have $$\text{rank}(S_{ty}) = \text{rank } \mathbb{B}(\{p_{ij}(\alpha_y), j \in [l]\}). \qquad (90)$$

Then, from (84) we know that the rank of Sty is at most a-s, which means in (89) we only need to consider p corresponding to the independent a-s columns of Sty. So, (89) is equivalent to $(a-s)^2$ linear requirements. For $\delta'_i \in \mathbb{E}$, we can view it as a unknowns over B, and we have $$\frac{(2e-i)(i-1)}{2}(a-s)^2 \leq \frac{e(e-1)}{2}(a-s)^2 \qquad (91)$$

linear requirements over B according to (86). Also knowing $\delta'_i$, we can solve $\delta_i = \delta_i^{q^e} = \delta'_i^{q^{e-s}}$. Therefore, we can find appropriate {δ1, δ2, ... δe} to make matrix S full rank when $$a \geq \frac{e(e-1)}{2}(a-s)^2. \qquad (92)$$

Then, let {η1, η2, ..., η′/a} be a basis for F over E, we have the el polynomials as {$n_w p_{ij}(x)$, w∈[l/a], i∈[e], j∈[a]}. Similar to Construction III, we know that vectors {$η_w V_{ij}$, w∈[l/a], i∈[e], j∈[a]} are linearly independent over B.

Therefore, we can recover the failed nodes and the repair bandwidth is $$b = \text{rank}_B(\{\eta_1 p_{ij}(x), \ldots, \eta_{l/a} p_{ij}(x) : i \in [e], j \in [a]\}) \qquad (93)$$

$$= \frac{l}{a} \text{rank}_B(\{p_{ij}(x) : i \in [e], j \in [a]\}) \leq \frac{el}{a}(n-e)(a-s).$$

In our scheme, we have constructions for arbitrary a, s, such that a|l, s≤a−1, while the existing schemes mainly considered the special casel=a. It should be noted that the scheme in [19] can also be used in the case of s=a−1 over E with repair bandwidth $$(n-e)e - \frac{e(e-1)(q-1)}{2}.$$

And, with l/a copies of the code, it can also reach the same repair bandwidth of our scheme. However, by doing so, the code is a vector code, but our scheme constructs a scalar code.

C. Multiple-Erasure Repair in Multiple Cosets

Recall that the scheme in Theorem 5 for a single erasure is a small sub-packetization code with small repair bandwidth for any number of helpers. When there are e erasures and d helpers, e≤n−k, k≤d≤n−e, we can recover the erasures one by one using the d helpers. However, the repaired nodes can be viewed as additional helpers and thus we can reduce the total repair bandwidth. Finally, for every helper, the transmitted information for different failed nodes has some overlap, resulting in a further bandwidth reduction.

Figure 6:
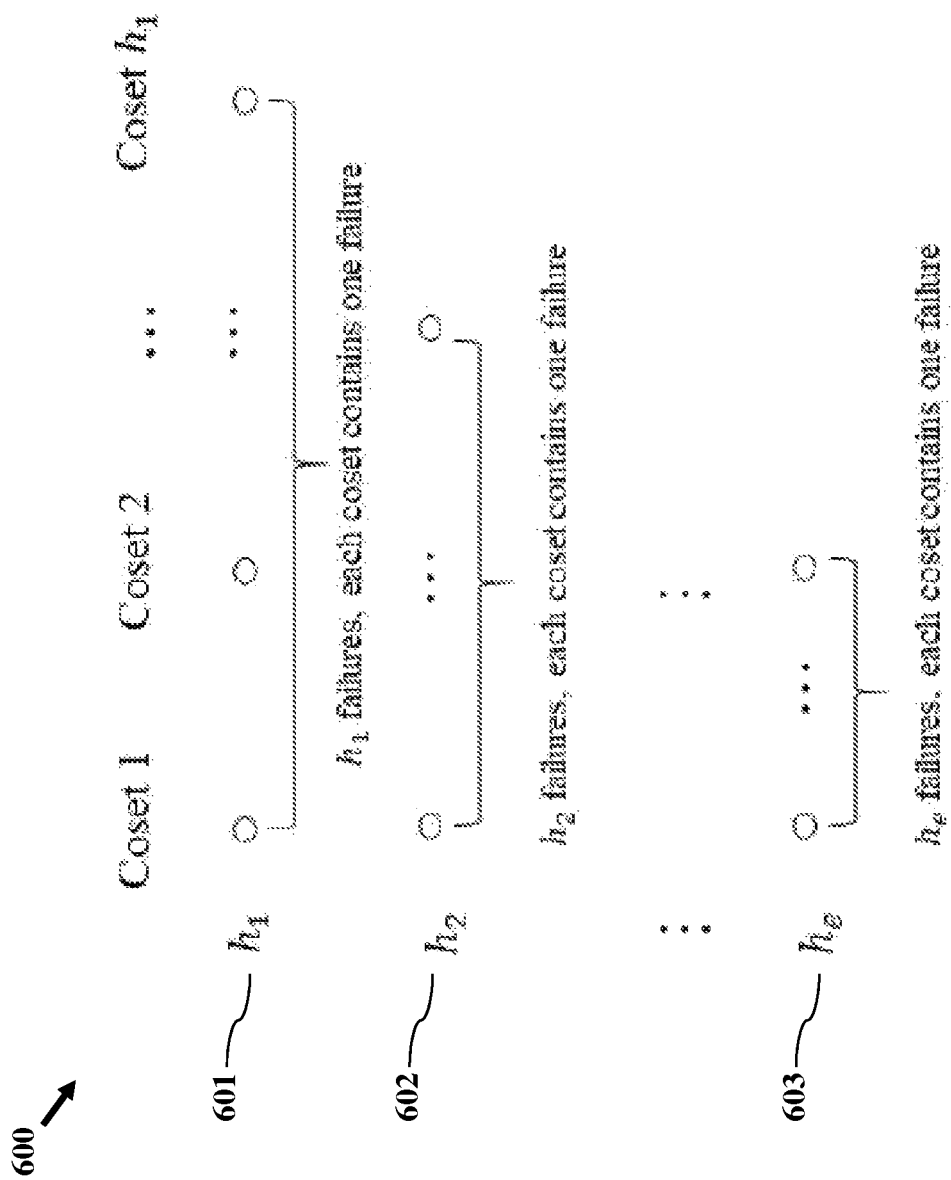
FIG. 6 shows erasure locations in various data packets according to one or more embodiments.

FIG. 6 shows erasure locations in various data packets according to one or more embodiments. In particular, FIG. 6 depicts the number of erasures or failures present in various cosets. In one embodiment, an erasure may be present in each of $h_1$ cosets 601, $h_2$ cosets 602, and $h_e$ cosets 603.

According to one embodiment, using an original code, the code is extended to a new code with evaluation points as in (44). If a helper is in the same coset as any failed node, it transmits naively its entire data; otherwise, it transmits the same amount as the scheme in the original code. After the extension, the new construction decreases the sub-packetization size for fixed n, and the bandwidth is only slightly larger than the original code. The location of the e erasures are described by $h_i$, i∈[e], where $0 \leq h_i \leq e$, $h_1 \geq h_2 \geq \ldots \geq h_e$, $\Sigma_{i=1}^{e} h_i = e$. We assume the erasures are located in $h_1$ cosets 601, and after removing one erasure in each coset, the remaining erasures are located in $h_2$ cosets 602. Then, for the remaining erasures, removing one in each coset, we get the rest of erasures in $h_e$ cosets, and so on. FIG. 6 also shows the erasure locations described above.

In our scheme, we first repair $h_1$ failures, one from each of the $h_1$ cosets. Then, for 2≤i≤e, we repeat the following: After repairing $h_1, h_2, \ldots, h_{i-1}$ failures, we view these repaired nodes as helpers and repair next $h_1$ failures, one from each of the hi cosets. The repair bandwidth of the scheme is showed in the following theorem.

Theorem 8. Let q be a prime number. There exists an RS(n, k) code over $\mathbb{F} = GF(q^l)$ for which $$\ell = a s q_1 q_2 \cdots q \frac{n}{q^a - 1},$$

where $q_i$ is the i-th prime number that satisfies $s|(q_i-1)$, $s=(n-k)!$ and a is an integer. For e erasures and d helpers, $e \leq n-k$, $k \leq d \leq n-e$, the average repair bandwidth measured in symbols over $\mathbb{B}$ is $$b \leq \frac{d\ell}{(n-e)} \left[ (h_1(q^a - 1) - e) + (n - h_1(q^a - 1)) \sum_{i=1}^{e} \frac{h_i}{d - k + \sum_{v=1}^{i} h_v} \right], \quad (94)$$

Where $h_i$, $i \in [e]$ are the parameters that define the location of erasures in FIG. 6

Proof: We first prove the case when a and l' are relatively prime using Lemma 3, the case when a and l' are not necessarily relatively prime are proved in Appendix A. We use the code in [22] as the original code. Let $\mathbb{F}_q(\alpha)$ be the field obtained by adjoining $\alpha$ to the base field $\mathbb{B} = GF(q)$. Similarly let $\mathbb{F}_q(\alpha_1, \alpha_2, \ldots, \alpha_n)$ be the field for adjoining multiple elements. Let $\alpha_i$ be an element of order $q_i$ over $\mathbb{B}$ and h be the number of erasures in the original code. The original code is defined in the field $\mathbb{F}' = GF(q^{l'}) = GF(q^{sq_1q_2\cdots q_n})$, which is the degree-s of extension of $\mathbb{F}_q(\alpha_1, \alpha_2, \ldots \alpha_n)$. The evaluation points are $A' = \{\alpha_1, \alpha_2, \ldots \alpha_n'\}$. The subfield $\mathbb{F}'_{[h]}$ is defined as $\mathbb{F}'_{[h]} = \mathbb{F}_q(\alpha_j, j=h+1, h+2, \ldots, n')$, and $\mathbb{F}'_i$ is defined as $\mathbb{F}_q(\alpha_j j \neq i, j \in [n'])$.

In the original code, we assume without loss of generality that there are h failed nodes $f(\alpha_1), f(\alpha_2), \ldots, f(\alpha_h)$. Consider the polynomials for failed node $f(\alpha_i)$, $1 \leq i \leq h$, as $$p'_{ij}(x) = x^{j-1} g'_i(x), j \in [s_i], x \in \mathbb{F}', \quad (95)$$

where $$g'_i(x) = \prod_{\alpha \in A'/(R' \cup \{\alpha_j, \alpha_{i+1}, \ldots \alpha_h\})} (x - \alpha), x \in \mathbb{F}', \quad (96)$$

for $R' \subseteq A'$, $|R'|=d'$ being the set of helpers. The set of repair polynomials are $\{\eta_{it} p'_{ij}(x), i \in [h], j \in [s_i], t \in \left[\frac{sq_i}{s_i}\right]\}$, where $\eta_{it} \in \mathbb{F}'$ are constructed in [22] to ensure that $\{\eta_{it} p'_{i1}(\alpha i), \eta_{it} p'_{i2}(\alpha_i), \ldots, \eta_{it} p'_{is_i}(\alpha_i)\}$ forms the basis for $\mathbb{F}'$ over $\mathbb{F}'_i$.

Then, the failed nodes are repaired one by one from $$tr_{\mathbb{F}'/\mathbb{F}'_i}(v_{\alpha}, \eta_{it} p'_{ij}(\alpha_i) f'(\alpha_i)) = -\sum_{e=1, e \neq i}^{n} tr_{\mathbb{F}'/\mathbb{F}'_i}(v_e, \eta_{it} p'_{ij}(\alpha_e) f'(\alpha_e)). \quad (97)$$

For $x \notin R' \cup \{\alpha_i, \alpha_{i+1}, \ldots \alpha_h\}$, $p'_{ij}(x)=0$ and no information is transmitted. Once $f'(\alpha_i)$ is recovered, it is viewed as a new helper for the failures $i+1, i+2, \ldots, h$.

Since $\mathbb{F}'_{[h]} \leq \mathbb{F}'_i$, the information transmitted from the helper $\alpha_\epsilon$ can be represented as $$tr_{\mathbb{F}'/\mathbb{F}'_i}(v_e, \eta_{it} p'_{ij}(\alpha_e) f'(\alpha_e)) = \quad (98)$$

$$tr_{\mathbb{F}'/\mathbb{F}'_i}\left(\xi'_{im} \sum_{m=1}^{q'_i} tr_{\mathbb{F}'_i/\mathbb{F}'_{[h]}}(v_e \eta_{it} \xi_{im} p'_{ij}(\alpha_e) f'(\alpha_e))\right) =$$

$$\sum_{m=1}^{q'_i} \xi'_{im} tr_{\mathbb{F}'_i/\mathbb{F}'_{[h]}}(v_e \eta_{it} \xi_{im} p'_{ij}(\alpha_e) f'(\alpha_e)),$$

where $$q'_i = \frac{q_1 q_2 \cdots q_h}{q_i},$$

$\{\xi'_{i1}, \xi'_{i2}, \ldots, \xi'_{iq'_i}\}$ and $\{\xi'_{i1}, \xi'_{i2}, \ldots, \xi'_{iq'_i}\}$ are the dual basis for $\mathbb{F}'_i$ over $\mathbb{F}'_{[h]}$. We used the fact that $tr_{\mathbb{F}'_i/\mathbb{F}'_i}(tr_{\mathbb{F}'_i/\mathbb{F}'_i/\mathbb{F}'_{[h]}}(\cdot)) = tr_{\mathbb{F}'_i/\mathbb{F}'_{[h]}}(\cdot)$, for $\mathbb{F}'_{[h]} \leq \mathbb{F}'_i \leq \mathbb{F}'$.

The original code satisfies the full rank condition for every $i \in [h]$, and each helper $\alpha$ transmits $$rank_{\mathbb{F}'_{[h]}}\left(\{\eta_{ih} \xi_{im} p'_{ij}(\alpha_e): i \in [h] j \in [s_i], t \in \left[\frac{sq}{s_i}\right], m \in [q'_i]\}\right) = \quad (99)$$

$$rank_{\mathbb{F}'_{[h]}}\left(\{\eta_{it} \xi_{im}: i \in [h], t \in \left[\frac{sq_i}{s_i}\right], m \in [q'_i]\}\right) =$$

$$\frac{h\ell'}{(d' - k' + h) \prod_{v=h+1}^{n'} p_v}$$

symbols over $\mathbb{F}'_{[h]}$, which achieves the MSR bound.

In our new code, we extend the field to $\mathbb{F} = GF(q^l)$, $l=al'$, by adjoining an order-a element $\alpha_{n+1}$ to F. We set $d-k=d'-k'$. The new evaluation points consist of $A = \{\alpha_1 \mathbb{E}^*, \alpha_2 \mathbb{E}^*, \ldots, \alpha'_n \mathbb{E}^*\}$, $\mathbb{E} = GF(q^a) = \mathbb{F}_q(\alpha_{n+1})$ The subfield F[h] is defined by adjoining $\alpha_{n+1}$ to $\mathbb{F}'_{[h]}$, and $\mathbb{F}_i$ is defined as $\mathbb{F}_q(\alpha_j, \neq i, j \in [n+1])$.

Assume first that each coset contains at most one failure, and there are h failures in total. We assume with-out loss of generality that the evaluation points of the h failed nodes are in $\{\alpha_1 \mathbb{E}^*, \alpha_2 \mathbb{E}^*, \ldots, \alpha_h \mathbb{E}^*\}$ and they are $\alpha_1 \gamma_1, \alpha_2 \gamma_2, \ldots, \alpha_h \gamma_h$ for some $\gamma_w \in \mathbb{E}$, $w \in [h]$ Let the set of helpers be $R \subseteq A$, $|R|=a$. We define the polynomials as $$p_{ij}(x) = x^{j-1} g_i(x), j \in [s_i], x \in \mathbb{F}, \quad (100)$$

where $$g_i(x) = \prod_{\alpha \in A/(R \cup \{\alpha_i \gamma_i, \alpha_{i+1} \gamma_{i+1}, \ldots \alpha_h \gamma_h\})} (x - \alpha), x \in \mathbb{F}. \quad (101)$$

The set of repair polynomials are $\{\eta_{it} p_{ij}(x), i \in [h], j \in$ where $\eta_{it} \in \mathbb{F}'$ are the dame as the original construction. We use field $F_i$ as the base filed for the repair.

$$tr_{\mathbb{F}/\mathbb{F}_i}(v_{\alpha_i \gamma_i} \eta_{it} p_{ij}(\alpha_i \gamma_i) f(\alpha_i \gamma_i)) = -\sum_{\alpha \in A, \alpha \neq \alpha_i \gamma_i} tr_{\mathbb{F}/\mathbb{F}_i}(v_\alpha \eta_{it} p_{ij}(\alpha) f(\alpha)). \quad (102)$$

If $x \in R \cup \{\alpha_i \gamma_i, \alpha_{i+1}\gamma_{i+1}, \ldots, \alpha_h\gamma_h\}$, $p_{ij}(x)=0$ and no information is transmitted. Next, we consider all other nodes. If $x=\alpha_i\gamma$ for some $\gamma \in \mathbb{E}^*$, we have $$p_{ij}(x) = \gamma^{j-1}\alpha_i^{j-1}g_i(x). \tag{103}$$

Since $\eta_{it}, \alpha_i \in \mathbb{F}'$ and $g_i(x)$ is a constant independent of j, we have $$\operatorname{rank}_{\mathbb{F}_i}\left(\left\{\eta_{it}p_{i1}(x), \ldots, \eta_{it}p_{is_i}(x): t \in \left[\frac{sq_i}{s_i}\right]\right\}\right) = \tag{104}$$
$$\operatorname{rank}_{\mathbb{F}_i}\left(\left\{\eta_{it}, \ldots, \eta_{it}\alpha_i^{s-1}: t \in \left[\frac{sq_i}{s_i}\right]\right\}\right) =$$
$$\operatorname{rank}_{\mathbb{F}'_i}\left(\left\{\eta_{it}p'_{i1}(\alpha_i), \ldots, \eta_{it}p'_{is_i}(\alpha_i): t \in \left[\frac{sq_i}{s_i}\right]\right\}\right)$$

Which indicates the full rank. Note that the last equation follows from Lemma 3. As a result we can recover the failed nodes and each helper in the cosets containing the failed nodes transmit $l$ symbols in B.

For $x=\alpha_\epsilon\gamma$, $\epsilon > h$, since $\mathbb{F}[h]$ is a subfield of $\mathbb{F} \mathbb{F}_i$ and from Lemma 3 we know that $\{\xi_{i1}, \xi_{i2}, \ldots, \xi_{iq'_i}\}$ and $\{\xi'_{i1}, \xi'_{i2}, \ldots, \xi'_{iq'_i}\}$ are also the dual basis for $\mathbb{F}_i$ over $\mathbb{F}[h]$ then similar to (98) we have $$\operatorname{tr}_{\mathbb{F}/\mathbb{F}_i}(v_\alpha\eta_{it}p_{ij}(x)f(x)) = \sum_{m=1}^{q'_i} \xi'_{im}\operatorname{tr}_{\mathbb{F}/\mathbb{F}_{[h]}}(v_\epsilon\eta_{it}\xi_{im}p_{ij}(x)f(x)). \tag{105}$$

Using the fact that $g_i(x)$ is a constant independent of j, $x \in \mathbb{F}_{[h]}$ and $\eta_{it}\xi_{im} \in \mathbb{F}'$, from Lemma 3 we know that $$\operatorname{rank}_{\mathbb{F}_{[h]}}\left(\left\{\eta_{it}\xi_{im}p_{ij}(x): i \in [h], j \in [s_i], t \in \left[\frac{sq_i}{s_i}\right], m \in [q'_i]\right\}\right) = \tag{106}$$
$$\operatorname{rank}_{\mathbb{F}_{[h]}}\left(\left\{\eta_{it}\xi_{im}: i \in [h], t \in \left[\frac{sq_i}{s_i}\right], m \in [q'_i]\right\}\right) =$$
$$\operatorname{rank}_{\mathbb{F}'_{[h]}}\left(\left\{\eta_{it}\xi_{im}: i \in [h], t \in \left[\frac{sq_i}{s_i}\right], m \in [q'_i]\right\}\right) =$$
$$\operatorname{rank}_{\mathbb{F}'_{[h]}}\left(\left\{\eta_{it}\xi_{im}p'_{ij}(\alpha_\epsilon): i \in [h], j \in [s_i], t \in \left[\frac{sq_i}{s_i}\right], m \in [q'_i]\right\}\right) =$$
$$\frac{h\ell'}{(d-k+h)\prod_{v=h+1}^{n'} p_v},$$

where the last equality follows from (99) and $d'-k'=d-k$. So, each helper in the other cosets transmits $$\frac{h\ell}{d-k+h}$$

symbols over B.

Using the above results, we calculate the repair bandwidth in two steps.

Step 1. We first repair h1 failures, one from each of the h1 cosets. From (104), we know that in the h1 cosets containing the failed nodes, we transmit symbols over B. By (106), for each helper in other cosets, we transmit $$\frac{h_1\ell}{d-k+h_1}$$

symbols over B.

Step 2. For $2 \leq i \leq e$, repeat the following. After repairing h1, h2, ..., hi-1 failures, these nodes can be viewed as helpers for repairing next hi failures, one from each of the hi cosets. So, we have $$d + \sum_{v=1}^{i-1} h_v$$

helpers for the hi failures. $v=1$

For the helpers in the h1 cosets containing the failed nodes, we already transmit symbols over B in Step 1 and no more information needs to be transmitted. For each helper in other cosets, we transmit $$d + \sum_{v=1}^{i-1} h_v$$

symbols over B.

Thus, we can repair all the failed nodes. The repair bandwidth can be calculated as (94).

Suppose that e failures are to be recovered. Compared to the naive strategy which always uses d helpers to repair the failures one by one, our scheme gets a smaller repair bandwidth since the recovered failures are viewed as new helpers and we take advantage of the overlapped symbols for repairing different failures.

In the case when $n \gg e(q^a-1)$, or when we arrange nodes with correlated failures in different cosets, we can assume that all the erasures are in different cosets, h1=e, h2=h3= ... =he=0. For example, if correlated failures tend to appear in the same rack in a data center, we can assign each node in the rack to a different coset. Under such conditions, we simplify the repair bandwidth as $$b \leq \frac{d}{n-e}\frac{e\ell}{d-k+e}(n-e+(d-k)(q^a-2)). \tag{107}$$

Indeed, one can examine the expression of (94). With the constraint that $\Sigma_{i=1}^e h_i = e$, the first term $h_1(q^a-1)$ is an increasing function of h1 and the second term $$(n-h_1(q^a-1))\sum_{i=1}^e \frac{h_i}{d-k+\sum_{v=1}^i h_v}$$

is a decreasing function of h1. Under the assumption that n is large, the second term dominates, and increasing h1 reduces the total repair bandwidth b. Namely, h1=e corresponds to the lowest bandwidth for large code length.

In particular, when d=n-e, h1=e, we have $$b = \frac{e\ell}{n-k}(n-e) + \frac{e\ell}{n-k}(n-k-e)(q^a-2), \tag{108}$$

where the second term is the extra repair bandwidth compared with the MSR bound.

Numerical Evaluations and Discussions

In this subsection, we compare our schemes for multiple erasures with previous results, including separate repair and schemes. Repairing multiple erasures simultaneously can save repair bandwidth compared to repairing erasures separately. Assuming e failures happen one by one, and the rest of n−1 nodes are available as helpers initially when the first failure occurs. We can either repair each failure separately using n−1 helpers, or wait for e failures and repair all of them simultaneously with n−e helpers. Table III shows a comparison. For our scheme in one coset, separate repair needs a repair bandwidth of $$\frac{e\ell}{a}(n-1)(a-s),$$

symbols in B, simultaneous a repair requires a bandwidth of $$\frac{e\ell}{a}(n-e)(a-s).$$

For our scheme in multiple cosets, we can repair the failures separately by n−1 helpers with the bandwidth of $$\frac{e\ell}{n-k}[n-1+(n-k-1)(q^a-2)],$$

and with simultaneous repair we can achieve the bandwidth of $$\frac{e\ell}{n-k}[n-e+(n-k-e)(q^a-2)].$$

One can see that in both constructions, simultaneous repair outperforms separate repair.

Next we compare our scheme for multiple erasures with the existing schemes. FIG. 4 shows the normalized repair bandwidth for different schemes when n=16, k=8, e=2, q=2. Table IV shows the comparison when n=64, k=32, e=2, q=2. We make the following observations:
1) For fixed (n, k) and our scheme with multiple cosets, we use the parameter a to adjust the sub-packetization size. From Theorem 8, we know that $l \approx a \cdot$ $$\left(\frac{n}{q^a-1}\right)^{\left(\frac{n}{q^a-1}\right)}$$

which means that increasing a will de-crease the sub-packetization. In our schemes with one coset and two cosets, the parameter a is determined by the code length n, so increasing l will not change a or the normalized repair bandwidth.
2) When l grows larger ($4<l<2.1\times10^7$ in FIG. 4 $6<l<3.3\times10^{11}$ in Table IV) the embodiments have the smallest repair bandwidth.
3) For extremely large l ($l\geq 2.1\times10^7$ in FIG. 4, $l\geq 3.3\times 10^{11}$ in Table IV), the embodiments in multiple cosets have the smallest repair bandwidths.

Table III illustrates Repair bandwidth of different schemes for e erasures

TABLE III

|  | repair bandwidth | number of helpers |
| --- | --- | --- |
| Single-erasure repair in one coset (separate repair) | $\frac{e\ell}{a}(n-1)(a-s)$ | n − 1 |
| Multiple-erasure repair in one coset (simultaneous repair) | $\frac{e\ell}{a}(n-e)(a-s)$ | n − e |
| Single-erasure repair in mulitple cosets (separate repair) | $\frac{e\ell}{n-k}[n-1+(n-k-1)(q^a-2)]$ | n − 1 |
| Multiple-erasure repair in mulitple cosets (simultaneous repair) | $\frac{e\ell}{n-k}[n-e+(n-k-e)(q^a-2)]$ | n − e |

Table IV shows normalized repair bandwidth $$\frac{b}{(n-e)\ell}$$

for different schemes when n=64, k=32, e=2, q=2.

TABLE IV

|  | $\ell = 6$ | $\ell = 7$ | $\ell = 8$ | $\ell = 9$ | ... | $\ell = 3.3 \times 10^6$ | $\ell = 3.3 \times 10^{11}$ | $\ell = 3.9 \times 10^{115}$ |
| --- | --- | --- | --- | --- | --- | --- | --- | --- |
| Normalized bandwidth for Scheme 1 in [19] | 0.42 | 0.50 | 0.52 | 0.52 | ... | 0.52 | 0.52 | 0.52 |
| Normalized bandwidth for our scheme in one coset | 0.49° | 0.49 | 0.49 | 0.49 | ... | 0.49 | 0.49 | 0.49 |

TABLE IV-continued

| | $\ell = 6$ | $\ell = 7$ | $\ell = 8$ | $\ell = 9$ | ... | $\ell = 3.3 \times 10^6$ | $\ell = 3.3 \times 10^{11}$ | $\ell = 3.9 \times 10^{115}$ |
|---|---|---|---|---|---|---|---|---|
| Normalized bandwidth for our scheme in multiple cosets | | | | | | 0.52 | 0.48 | 0.0625* |

Figure 7:
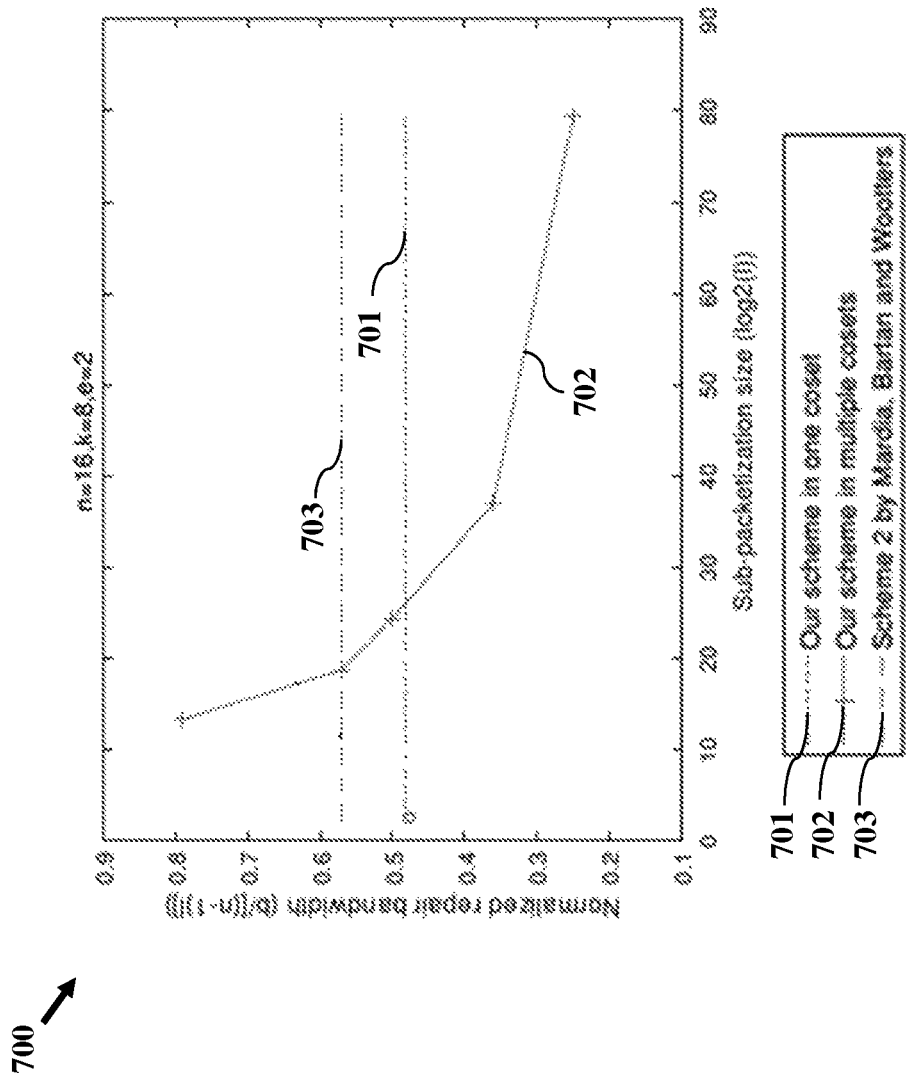
FIG. 7 illustrates a graph representation showing normalized repair bandwidth values that correspond to various subpacketization sizes as a result of implementing different repair schemes in accordance with one or more embodiments.

FIG. 7 illustrates a graph representation showing normalized repair bandwidth values that correspond to various subpacketization sizes as a result of implementing different repair schemes that are in accordance with one or more embodiments described herein. Specifically, FIG. 7 depicts a relationship between various subpacketization sizes and normalized repair bandwidths upon the implementations of the following repair schemes: current scheme in one coset 701, current scheme in multiple cosets 702, MBW Scheme 703. The MBW scheme 703 relates to scheme 2, which is designed by Mardia, Bartan, and Wootters. FIG. 7 also illustrates a comparison of the schemes, q=2, n=16, k=8, e=2, x-axis is the log scale sub-packetization size, y-axis is the normalized repair bandwidth. Moreover, the normalized repair bandwidth values resulting from implementation of different schemes to correct a single erasures in one coset and multiple cosets, and multiple erasures in one coset and multiple cosets are shown in Table III and Table IV.

As described above, three Reed-Solomon code repair schemes are provided that include a tradeoff between the sub-packetization size and the repair bandwidth. Our schemes (current scheme in one coset 701 and current scheme in multiple cosets 702) choose the evaluation points of the Reed-Solomon code from one, two, or multiple cosets of the multiplicative group of the underlying finite field. For a single erasure, when the sub-packetization size is large, the scheme in multiple cosets has better performance, it approaches the MSR bound. When sub-packetization size is small, the scheme in one coset has advantages in repair bandwidth. The scheme in two cosets has smaller repair bandwidth with certain parameters in between the other two cases. For multiple erasures, our scheme in one coset has constructions for arbitrary redundancy n-k and our scheme in multiple cosets reduced the sub-packetization size of an MSR code. The two schemes together provided a set of tradeoff points and we observe similar tradeoff characteristics as in the single erasure case. In spite of several tradeoff points we provided in this paper, the dependence of the sub-packetization size versus the repair bandwidth is still an open question.

Figure 8:
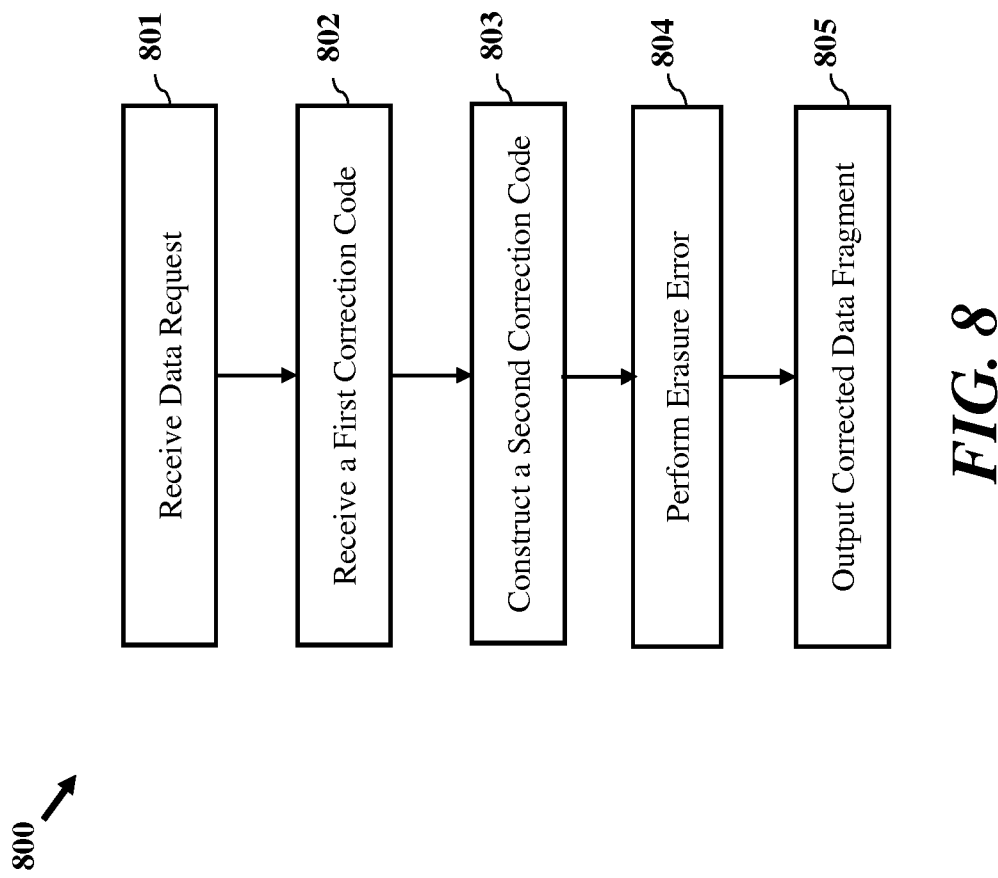
FIG. 8 illustrates a process for error correction of distributed data according to one or more embodiments that includes modifying a Reed-Solomon correction code.

FIG. 8 illustrates a process 800 for error correction of distributed data based on modifying a Reed-Solomon correction code according to one or more embodiments described herein.

According to one embodiment, process 800 may be initiated at block 801 when a device (e.g., repair device 120 depicted in FIG. 1) receives a data request from one or more client devices (e.g., one or more of client devices $115_{1-n}$).

At block 802, process 800 includes receiving a first correction code for a plurality of data fragments stored in a plurality of storage nodes. The first correction code is a Reed-Solomon code that has a data symbol for each of the plurality of storage nodes and is represented as a polynomial over a finite field with a sub-packetization size.

At block 803, process 800 includes constructing a second correction code that is constructed in response to at least one unavailable storage node of the plurality of storage nodes. The second correction code is represented as a second polynomial over a second finite field and has an increased subpacketization size relative to the first polynomial. In one embodiment, the second correction code is a new Reed-Solomon code. The second correction code may be constructed using one or more operations discussed relative to block 210 in process 200 described above. Moreover, it is noted that the unavailability may be due to an erasure error in one of the plurality of data fragments. An erasure error may occur if a storage location of a particular symbol included in one of the data fragments stored in the storage nodes is unknown.

At block 804, process 800 includes performing erasure repair using the second correction code. In one embodiment, the second correction code is applied to available data fragments of the plurality of data fragments for erasure repair. Additionally, the erasure error utilizes at least one coset of a multiplicative group of the second finite field. In one embodiment, repairing the erasure includes using a first dual codeword and a second dual codeword as repair polynomials. In this embodiment, a trace function is combined with the dual code words to generate fragments. In one embodiment, the trace function is used to obtain subfield symbols, as described in the "Preliminaries" section below. Moreover, the use of the trace function in combination with dual codewords as described in the "Reed-Solomon Repair Schemes for Multiple Erasures" section. The erasure repair may be performed using one or more operations discussed relative to block 215 in process 200 described above.

At block 805, process 800 includes outputting a corrected data fragment based on the erasure repair that is performed in block 215. In one embodiment, errors in one or more of the plurality of data fragments are corrected and the data fragments are restored in their entirety such that all data fragments are accessible.

Repairing Reed-Solomon (14, 10) in $GF(2^8)$

Another embodiment is directed to providing an algorithm to repair a single node failure in the (14,10) Reed-Solomon code over $GFL(2^8)$ in a system (e.g., Facebook's f4 system). Embodiments are directed to an algorithm that can repair any failed node and requires only 4 bits from each remaining node Repair Algorithm for RS (14, 10) Code Notation: [a] represents $\{1, 2, \ldots, a\}$ for a positive integer a.

The RS (14, 10) code has n=14 codeword symbols and k=10 information symbols. In a storage system, different symbols are stored in different nodes. The symbols are over the finite field $\mathbb{F} = GF(2^8) = \{0, 1, \beta, \beta^2, \ldots, \beta^{254}\}$, where $\beta$ is the root of $1+x^2+x^3+x^4+x^8=0$. For the given information symbols $u_j \in \mathbb{F}$, j=0, 1, . . . , 9, let f be the polynomial $$f(x) = \sum_{j=0}^{9} u_j x^j.$$

RS codeword symbols are evaluations of the polynomial f and erasures can be corrected using interpolation. By restricting the evaluation points to a subfield, one obtains a low repair bandwidth given the field size. Consider the subfield $\mathbb{E} = GF(2^4) = \{0, 1, \beta^{17}, \beta^{17\cdot 2}, \ldots, \beta^{17\cdot 14}\}$ of F. A set of evaluation points is chosen from E, and denote it by $A = \{\alpha_1, \alpha_2, \ldots, \alpha_{14}\} = \{1, \beta^{17}, \beta^{17\cdot 2}, \beta^{17\cdot 3}, \ldots, \beta^{17\cdot 13}\}$. Then, the 14 codeword symbols, in the 14 nodes, are $$\left\{ N_m = f(\alpha_m) = \sum_{j=0}^{\alpha} u_j \alpha_m^j : \alpha_m \in A \right\}.$$

Algorithm steps are described below according to one or more embodiments. Assuming the node $N_* = f(\alpha^*)$ fails, $\alpha^* \in A$. The transmitted symbols from the other nodes (called helpers) are related to the failed node symbol through the dual codeword c1, c2, ..., c14) of RS(14,10):

$$c_* N_* = \sum_{m=1, m \neq *}^{14} c_m N_m.$$

Table V shows column multipliers $v_m$ corresponding to $A = \{1, \beta^{17}, \beta^{17\cdot 2}, \ldots, \beta^{17\cdot 13}\}$

TABLE V

| $v_1$ | $v_2$ | $v_3$ | $v_4$ | $v_5$ | $v_6$ | $v_7$ | $v_8$ | $v_9$ | $v_{10}$ | $v_{11}$ | $v_{12}$ | $v_{13}$ | $v_{14}$ |
|---|---|---|---|---|---|---|---|---|---|---|---|---|---|
| $\beta^{51}$ | $\beta^{136}$ | 1 | $\beta^{51}$ | $\beta^{221}$ | $\beta^{34}$ | $\beta^{238}$ | $\beta^{136}$ | $\beta^{238}$ | $\beta^{221}$ | $\beta^{102}$ | $\beta^{102}$ | $\beta^{34}$ | 1 |

Table VI shows a dual basis for each node.

TABLE VI

| Failed node | $N_1$ | $N_2$ | $N_3$ | $N_4$ | $N_5$ | $N_6$ | $N_7$ | $N_8$ | $N_9$ | $N_{10}$ | $N_{11}$ | $N_{12}$ | $N_{13}$ | $N_{14}$ |
|---|---|---|---|---|---|---|---|---|---|---|---|---|---|---|
| $\gamma_1'$ | $\beta^{203}$ | $\beta^{118}$ | $\beta^{254}$ | $\beta^{203}$ | $\beta^{33}$ | $\beta^{220}$ | $\beta^{16}$ | $\beta^{118}$ | $\beta^{16}$ | $\beta^{33}$ | $\beta^{152}$ | $\beta^{152}$ | $\beta^{220}$ | $\beta^{254}$ |
| $\gamma_2'$ | $\beta^{152}$ | $\beta^{67}$ | $\beta^{203}$ | $\beta^{152}$ | $\beta^{237}$ | $\beta^{169}$ | $\beta^{220}$ | $\beta^{67}$ | $\beta^{220}$ | $\beta^{237}$ | $\beta^{101}$ | $\beta^{101}$ | $\beta^{169}$ | $\beta^{203}$ |
| $\gamma_3'$ | $\beta^{84}$ | $\beta^{254}$ | $\beta^{135}$ | $\beta^{84}$ | $\beta^{169}$ | $\beta^{101}$ | $\beta^{152}$ | $\beta^{254}$ | $\beta^{152}$ | $\beta^{169}$ | $\beta^{33}$ | $\beta^{33}$ | $\beta^{101}$ | $\beta^{135}$ |
| $\gamma_4'$ | $\beta^{16}$ | $\beta^{186}$ | $\beta^{67}$ | $\beta^{16}$ | $\beta^{101}$ | $\beta^{33}$ | $\beta^{84}$ | $\beta^{186}$ | $\beta^{84}$ | $\beta^{101}$ | $\beta^{220}$ | $\beta^{220}$ | $\beta^{33}$ | $\beta^{67}$ |
| $\gamma_5'$ | $\beta^{187}$ | $\beta^{102}$ | $\beta^{238}$ | $\beta^{187}$ | $\beta^{17}$ | $\beta^{204}$ | 1 | $\beta^{102}$ | 1 | $\beta^{17}$ | $\beta^{136}$ | $\beta^{136}$ | $\beta^{204}$ | $\beta^{238}$ |
| $\gamma_6'$ | $\beta^{136}$ | $\beta^{51}$ | $\beta^{187}$ | $\beta^{136}$ | $\beta^{221}$ | $\beta^{153}$ | $\beta^{204}$ | $\beta^{51}$ | $\beta^{204}$ | $\beta^{221}$ | $\beta^{85}$ | $\beta^{85}$ | $\beta^{153}$ | $\beta^{187}$ |
| $\gamma_7'$ | $\beta^{68}$ | $\beta^{238}$ | $\beta^{119}$ | $\beta^{68}$ | $\beta^{153}$ | $\beta^{85}$ | $\beta^{136}$ | $\beta^{238}$ | $\beta^{136}$ | $\beta^{153}$ | $\beta^{17}$ | $\beta^{17}$ | $\beta^{85}$ | $\beta^{119}$ |
| $\gamma_8'$ | 1 | $\beta^{170}$ | $\beta^{51}$ | 1 | $\beta^{85}$ | $\beta^{17}$ | $\beta^{68}$ | $\beta^{170}$ | $\beta^{68}$ | $\beta^{85}$ | $\beta^{204}$ | $\beta^{204}$ | $\beta^{17}$ | $\beta^{51}$ |

In particular, a dual codeword corresponds to evaluations of a polynomial over F of degree at most n−k−1=3. Here the evaluations of 8 appropriate dual codeword polynomials are found in Step 1. In each helper, at most 4 evaluations are linearly independent, leading to the bandwidth reduction (Step 2). As in Step 3, we map symbols of F to sub-symbols of the base field, B=GF (2), using the trace function: $tr_{\mathbb{F}/\mathbb{B}}(x) = x + x^2 + x^4 \ldots + x^{128}$, where for every $r \in \mathbb{F}$ $tr_{\mathbb{F}/\mathbb{B}}(x) \in \mathbb{B}$. Taking trace on both sides of (2), one obtains 8 trace functions of the failed symbol in Step 4. Finally in Step 5, the following property is used to repair the failed symbol.

Let $\{\gamma_1, \gamma_2, \ldots, \gamma_8\}$ and $\{\gamma'_1, \gamma'_2, \ldots, \gamma'_8\}$ be dual basis for F over B, then any symbol $x \in F$ can be reconstructed from its 8 trace functions: $x = \sum_{i=1}^{8} \gamma'_i tr_{\mathbb{F}/\mathbb{B}}(\gamma_i x)$ Repair algorithm for RS (14, 10) over $GF(2^8)$:

Step 1: For helper node m, such that $\alpha_m \in A \setminus \{\alpha^*\}$, evaluate 8 polynomials at $\alpha_m$, $\{v_m \eta_t p_{j,*}(\alpha_m), t \in [2], j \in [4]\}$, where $v_m$'s are the column multipliers and provided in Table V, $\{\eta_1, \eta_2\} = \{1, \beta\}$, and $p_{j,*}(x) =$ $$\xi_j \prod_{w \in W} (x - \alpha_* + w^{-1} \xi_j), \xi_j = \beta^{17(j-1)}, W = \{1, \beta^{17}, \beta^{68}\}.$$

Step 2: Polynomial evaluations calculated in Step 1 from the same helper are in a subspace of F with dimension 4. Let us represent a basis of this 4-dimensional subspace as {sm1, sm2, sm3, sm4}. If the result of Step 1 is 4 unique values, directly represent them as {sm1, sm2, sm3, sm4}. If there are more than 4 unique values, there are many different ways to find a basis of the subspace. One general way is to view the results as vectors over B8 and write them in an 8×8 matrix over B. Then, one can apply the row reduction method to derive a basis in the first 4 nonzero rows.

Step 3: Download the binary values $D_{m,j} = tr_{\mathbb{F}/\mathbb{B}}(S_{mj}N_m)$ $j \in [4]$ from node m.

Step 4: Since the trace function is a linear function and $v_m \eta_t p_{j,*}(\alpha_m)$ is in the subspace constructed by {sm1, sm2, sm3, sm4}, we use the information downloaded from the helpers to represent $tr_{\mathbb{F}/\mathbb{B}}(v_m \eta_t p_{j,*}(\alpha_m)N_m)$ and then calculate $tr_{\mathbb{F}/\mathbb{B}}(v_* \eta_t p_{j,*}(\alpha_*)N_*)$, $t \in [2], j \in [4]$ from $$tr_{\mathbb{F}/\mathbb{B}}(v_* \eta_t p_{j,*}(\alpha_*)N_*) = -\sum_{m=1, m \neq *}^{14} tr_{\mathbb{F}/\mathbb{B}}(v_m \eta_t p_{j,*}(\alpha_m)N_m).$$

Altogether, 8 bits are calculated for the failed node $N_*$.

Step 5: $\{v_* \eta_t p_{j,*}(\alpha_*): t \in [2]\ j \in [4]\}$ forms a basis for F over B. Let us present these 8 values as the set $\{\gamma 1, \gamma 2, \ldots, \gamma 8\}$. Then, we use the 8 bits calculated in Step 4 to reconstruct $N_*$ by $$N_* = \sum_{i=1}^{8} \gamma'_i tr_{\mathbb{F}/\mathbb{B}}(\gamma_i N_*),$$

where $\{\gamma'_1, \gamma'_2, \ldots, \gamma'_8\}$ is the dual basis of $\{\gamma_1, \gamma_2, \ldots, \gamma_8\}$ for F over B, and are provided in Table VI.

Example

According to one embodiment, a detailed repair algorithm example is provided in which the failed node is N1.

Step 1: The 8 polynomials $v_m \eta_t p_{j,1}(\alpha_m), t \in [2], j \in [4]$ are provided in Table VII.

TABLE VII

| THE COEFFICIENTS $v_m \eta_t p_{j,1}(\alpha_m)$, $t \in [2]$, $j \in [4]$ OF DIFFERENT HELPERS WHEN $N_1$ FAILS. | | | | | | | | | | | | | |
|---|---|---|---|---|---|---|---|---|---|---|---|---|---|
| helper node | $N_2$ | $N_3$ | $N_4$ | $N_5$ | $N_6$ | $N_7$ | $N_8$ | $N_9$ | $N_{10}$ | $N_{11}$ | $N_{12}$ | $N_{13}$ | $N_{14}$ |
| i = 1(t = 1, j = 1) | $\beta^{17}$ | 1 | 0 | 1 | $\beta^{34}$ | $\beta^{187}$ | $\beta^{102}$ | $\beta^{238}$ | $\beta^{17}$ | $\beta^{17}$ | $\beta^{119}$ | 0 | $\beta^{119}$ |
| i = 2(t = 1, j = 2) | $\beta^{17}$ | $\beta^{119}$ | $\beta^{68}$ | 0 | $\beta^{68}$ | $\beta^{68}$ | $\beta^{204}$ | $\beta^{85}$ | $\beta^{153}$ | $\beta^{51}$ | 0 | $\beta^{102}$ | $\beta^{238}$ |

TABLE VII-continued

THE COEFFICIENTS $v_m \eta_t p_{j,1}(\alpha_m)$, $t \in [2]$, $j \in [4]$ OF DIFFERENT HELPERS WHEN $N_1$ FAILS.

| helper node | $N_2$ | $N_3$ | $N_4$ | $N_5$ | $N_6$ | $N_7$ | $N_8$ | $N_9$ | $N_{10}$ | $N_{11}$ | $N_{12}$ | $N_{13}$ | $N_{14}$ |
|---|---|---|---|---|---|---|---|---|---|---|---|---|---|
| i = 3(t = 1, j = 3) | $\beta^{17}$ | 1 | $\beta^{204}$ | 0 | $\beta^{170}$ | 0 | $\beta^{68}$ | 0 | $\beta^{17}$ | $\beta^{51}$ | $\beta^{238}$ | $\beta^{136}$ | $\beta^{17}$ |
| i = 4(t = 1, j = 4) | $\beta^{119}$ | $\beta^{119}$ | 0 | $\beta^{119}$ | $\beta^{34}$ | $\beta^{187}$ | $\beta^{204}$ | 0 | $\beta^{51}$ | $\beta^{51}$ | $\beta^{17}$ | $\beta^{238}$ | $\beta^{17}$ |
| i = 5(t = 2, j = 1) | $\beta^{18}$ | $\beta$ | 0 | $\beta$ | $\beta^{35}$ | $\beta^{188}$ | $\beta^{103}$ | $\beta^{239}$ | $\beta^{18}$ | $\beta^{18}$ | $\beta^{120}$ | 0 | $\beta^{120}$ |
| i = 6(t = 2, j = 2) | $\beta^{18}$ | $\beta^{120}$ | $\beta^{69}$ | 0 | $\beta^{69}$ | $\beta^{69}$ | $\beta^{205}$ | $\beta^{86}$ | $\beta^{154}$ | $\beta^{52}$ | 0 | $\beta^{103}$ | $\beta^{239}$ |
| i = 7(t = 2, j = 3) | $\beta^{18}$ | $\beta$ | $\beta^{205}$ | 0 | $\beta^{171}$ | 0 | $\beta^{69}$ | 0 | $\beta^{18}$ | $\beta^{52}$ | $\beta^{239}$ | $\beta^{137}$ | $\beta^{18}$ |
| i = 8(t = 2, j = 4) | $\beta^{120}$ | $\beta^{120}$ | 0 | $\beta^{120}$ | $\beta^{35}$ | $\beta^{168}$ | $\beta^{205}$ | 0 | $\beta^{52}$ | $\beta^{52}$ | $\beta^{18}$ | $\beta^{239}$ | $\beta^{18}$ |

TABLE VIII

THE COEFFICIENTS $s_{m1}, s_{m2}, s_{m3}, s_{m4}$ OF DIFFERENT HELPERS WHEN $N_1$ FAILS.

| helper node | $N_2$ | $N_3$ | $N_4$ | $N_5$ | $N_6$ | $N_7$ | $N_8$ | $N_9$ | $N_{10}$ | $N_{11}$ | $N_{12}$ | $N_{13}$ | $N_{14}$ |
|---|---|---|---|---|---|---|---|---|---|---|---|---|---|
| $s_{m1}$ | $\beta^{17}$ | 1 | $\beta^{68}$ | 1 | $\beta^{34}$ | $\beta^{68}$ | $\beta^{102}$ | $\beta^{85}$ | $\beta^{17}$ | $\beta^{17}$ | $\beta^{119}$ | $\beta^{102}$ | $\beta^{119}$ |
| $s_{m2}$ | $\beta^{18}$ | $\beta$ | $\beta^{69}$ | $\beta$ | $\beta^{68}$ | $\beta^{69}$ | $\beta^{204}$ | $\beta^{86}$ | $\beta^{153}$ | $\beta^{18}$ | $\beta^{238}$ | $\beta^{136}$ | $\beta^{238}$ |
| $s_{m3}$ | $\beta^{119}$ | $\beta^{119}$ | $\beta^{204}$ | $\beta^{35}$ | $\beta^{195}$ | $\beta^{187}$ | $\beta^{103}$ | $\beta^{238}$ | $\beta^{18}$ | $\beta^{51}$ | $\beta^{120}$ | $\beta^{103}$ | $\beta^{120}$ |
| $s_{m4}$ | $\beta^{120}$ | $\beta^{120}$ | $\beta^{205}$ | $\beta^{69}$ | $\beta^{116}$ | $\beta^{188}$ | $\beta^{205}$ | $\beta^{239}$ | $\beta^{154}$ | $\beta^{52}$ | $\beta^{239}$ | $\beta^{137}$ | $\beta^{239}$ |

TABLE IX $\mathrm{tr}_{E/B}(v_m \eta_t p_{j,1}(\alpha_m) N_m)$ OF DIFFERENT HELPERS WHEN $N_1$ FAILS.

| helper node | $N_2$ | $N_3$ | $N_4$ | $N_5$ | $N_6$ | $N_7$ | $N_8$ | $N_9$ | $N_{10}$ | $N_{11}$ | $N_{12}$ | $N_{13}$ | $N_{14}$ |
|---|---|---|---|---|---|---|---|---|---|---|---|---|---|
| i = 1(t = 1, j = 1) | $D_{2,1}$ | $D_{3,1}$ | 0 | $D_{5,1}$ | $D_{6,1}$ | $D_{7,3}$ | $D_{8,1}$ | $D_{9,3}$ | $D_{10,1}$ | $D_{11,1}$ | $D_{12,1}$ | 0 | $D_{14,1}$ |
| i = 2(t = 1, j = 2) | $D_{2,1}$ | $D_{3,3}$ | $D_{4,1}$ | 0 | $D_{6,2}$ | $D_{7,1}$ | $D_{8,2}$ | $D_{9,1}$ | $D_{10,2}$ | $D_{11,3}$ | 0 | $D_{13,1}$ | $D_{14,2}$ |
| i = 3(t = 1, j = 3) | $D_{2,1}$ | $D_{3,1}$ | $D_{4,3}$ | 0 | $D_{6,1}+D_{6,2}$ | 0 | $D_{8,1}+D_{8,2}$ | 0 | $D_{10,1}$ | $D_{11,3}$ | $D_{12,2}$ | $D_{13,2}$ | $D_{14,1}+D_{14,2}$ |
| i = 4(t = 1, j = 4) | $D_{2,3}$ | $D_{3,3}$ | 0 | $D_{5,3}$ | $D_{6,1}$ | $D_{7,3}$ | $D_{8,2}$ | 0 | $D_{10,1}+D_{10,2}$ | $D_{11,3}$ | $D_{12,1}+D_{12,2}$ | $D_{13,1}+D_{13,2}$ | $D_{14,1}+D_{14,2}$ |
| i = 5(t = 2, j = 1) | $D_{2,2}$ | $D_{3,2}$ | 0 | $D_{5,2}$ | $D_{0,3}$ | $D_{7,4}$ | $D_{8,3}$ | $D_{9,4}$ | $D_{10,3}$ | $D_{11,2}$ | $D_{12,3}$ | 0 | $D_{14,1}$ |
| i = 6(t = 2, j = 2) | $D_{2,2}$ | $D_{3,4}$ | $D_{4,2}$ | 0 | $D_{6,4}$ | $D_{7,2}$ | $D_{8,4}$ | $D_{9,2}$ | $D_{10,4}$ | $D_{11,4}$ | 0 | $D_{13,3}$ | $D_{14,2}$ |
| i = 7(t = 2, j = 3) | $D_{2,2}$ | $D_{3,2}$ | $D_{4,4}$ | 0 | $D_{6,3}+D_{6,4}$ | 0 | $D_{8,3}+D_{8,4}$ | 0 | $D_{10,3}$ | $D_{11,4}$ | $D_{12,4}$ | $D_{13,4}$ | $D_{14,1}+D_{14,2}$ |
| i = 8(t = 2, j = 4) | $D_{2,4}$ | $D_{3,4}$ | 0 | $D_{5,4}$ | $D_{6,3}$ | $D_{7,4}$ | $D_{8,4}$ | 0 | $D_{10,3}+D_{10,4}$ | $D_{11,4}$ | $D_{12,3}+D_{12,4}$ | $D_{13,3}+D_{13,4}$ | $D_{14,1}+D_{14,2}$ |

Step 2: {sm1, sm2, sm3, sm4} are tabulated in Table VIII.
Step 3: Download $\mathrm{tr}_{F/B}(s_{mj} N_m)$, $j \in [4]$.
Step 4: {$\mathrm{tr}_{F/B}(v_m \eta_t p_{j,1}(\alpha_m) N_m)$ $t \in [2]$, $j \in [4]$} are calculated in Table VIX, and {$\mathrm{tr}_{F/B}(v_1 \eta_t p_{j,1}(1) N_1)$, $t \in [2]$, $j \in [4]$} are calculated from (3).
Step 5: We can calculate N1 from (4) and Table VI As such a detailed algorithm is provided to implement the repair of the RS(14, 10) code over $GF(2^8)$ in Facebook's f4 system. Our algorithm can repair one failed node and requires only 4 bits from each helper.

While this disclosure has been particularly shown and described with references to exemplary embodiments thereof, it will be understood by those skilled in the art that various changes in form and details may be made therein without departing from the scope of the claimed embodiments.

What is claimed is:

1. A method for error correction of distributed data including modifying a Reed-Solomon correction code, the method comprising:
   receiving, by a device, a first correction code via a communication network for a plurality of data fragments stored in a plurality of storage nodes, wherein the first correction code is a Reed-Solomon code having a data symbol for each the plurality of storage nodes and wherein the first correction code is represented as a first polynomial over a first finite field having a first sub-packetization size;
   constructing, by the device, a second correction code in response to at least one unavailable storage node of the plurality of storage nodes, wherein the second correction code is represented as a second polynomial over a second finite field, the second polynomial having an increased subpacketization size relative to the first polynomial;
   performing, by the device, erasure repair for the at least one unavailable storage node using the second correction code, wherein the second correction code is applied to available data fragments of the plurality of data fragments for erasure repair, wherein the erasure repair utilizes at least one coset of a multiplicative group of the second finite field; and
   outputting, by the device, a corrected data fragment based on the erasure repair.

2. The method of claim 1, wherein the second correction code is constructed for single erasure repair and erasure repair utilizes at least one of one coset and two cosets, wherein code length (n) and dimension (k) of the first correction code are maintained.

3. The method of claim 1, wherein the second correction code is constructed for single erasure repair and erasure repair utilizes multiple cosets, the code length (n) of the second correction code is increased and redundancy (r) is fixed.

4. The method of claim 1, wherein the second correction code is constructed for single erasure repair, the second correction code providing a scalar code with evaluation points selected from one coset.

5. The method of claim 1, wherein the second correction code is constructed for single erasure repair with evaluation points in selected two cosets, and erasure repair includes selection of correction code polynomials that have a full rank condition in a coset of an unavailable node and rank 1 when evaluated at another coset.

6. The method of claim 1, wherein the second correction code is constructed for single erasure repair, wherein evaluation points for erasure repair are chosen from multiple cosets to increase code length.

7. The method of claim 1, wherein the second correction code is constructed for repairing multiple erasures in the plurality of data fragments, wherein evaluation points for erasure repair are in at least one of one coset and multiple cosets.

8. The method of claim 1, wherein the second correction code is constructed for repairing multiple erasures in the plurality of data fragments, wherein erasure repair includes use of a helper node to reconstruct at least one symbol for a first data fragment, and wherein the reconstructed symbol is used for erasure repair of a second data fragment.

9. The method of claim 1, wherein the performing of the erasure repair includes using a first dual codeword and a second dual codeword as repair polynomials, and combining a trace function with dual codewords to generate fragments.

10. The method of claim 1, further comprising determining an erasure repair scheme for the plurality of data fragments.

11. A device configured for error correction of distributed data including modifying a Reed-Solomon correction code, the device comprising:
an interface configured to receive a first correction code via a communication network for a plurality of data fragments stored in a plurality of storage nodes, wherein the correction code is a Reed-Solomon code having a data symbol for each the plurality of storage nodes and wherein the first correction code is represented as a first polynomial over a first finite field having a first subpacketization size;
a repair module, coupled to the interface, wherein the repair module is configured to:
construct a second correction code in response to at least one unavailable storage node of the plurality of storage nodes, wherein the second correction code is represented as a second polynomial over a second finite field, the second polynomial having an increased subpacketization size relative to the first polynomial;
perform erasure repair for the at least one unavailable storage node using the second correction code, wherein the second correction code is applied to available data fragments of the plurality of data fragments for erasure repair, wherein the erasure repair utilizes at least one coset of a multiplicative group of the second finite field; and
output a corrected data fragment based on the erasure repair.

12. The device of claim 11, wherein the second correction code is constructed for single erasure repair and erasure repair utilizes at least one of one coset and two cosets, wherein code length (n) and dimension (k) of the first correction code are maintained.

13. The device of claim 11, wherein the second correction code is constructed for single erasure repair and erasure repair utilizes multiple cosets, the code length (n) of the second correction code is increased and redundancy (r) is fixed.

14. The device of claim 11, wherein the second correction code is constructed for single erasure repair, the second correction code providing a scalar code with evaluation points selected from one coset.

15. The device of claim 11, wherein the second correction code is constructed for single erasure repair with evaluation points in selected two cosets, and erasure repair includes selection of correction code polynomials that have a full rank condition in a coset of an unavailable node and rank 1 when evaluated at another coset.

16. The device of claim 11, wherein the second correction code is constructed for single erasure repair, wherein evaluation points for erasure repair are chosen from multiple cosets to increase code length.

17. The device of claim 11, wherein the second correction code is constructed for repairing multiple erasures in the plurality of data fragments, wherein evaluation points for erasure repair are in at least one of one coset and multiple cosets.

18. The device of claim 11, wherein the second correction code is constructed for repairing multiple erasures in the plurality of data fragments, wherein erasure repair includes use of a helper node to reconstruct at least one symbol for a first data fragment, and wherein the reconstructed symbol is used for erasure repair of a second data fragment.

19. The device of claim 11, wherein the performing of the erasure repair includes using a first dual codeword and a second dual codeword as repair polynomials, and combining a trace function with dual codewords to generate fragments.

20. The device of claim 11, further comprising determining an erasure repair scheme for the plurality of data fragments.

* * * * *